(12) United States Patent
Lee

(10) Patent No.: US 11,670,628 B2
(45) Date of Patent: Jun. 6, 2023

(54) DISPLAY DEVICE

(71) Applicant: Samsung Display Co., LTD., Yongin-si (KR)

(72) Inventor: Tae Hee Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 163 days.

(21) Appl. No.: 17/392,828

(22) Filed: Aug. 3, 2021

(65) Prior Publication Data

US 2022/0052033 A1 Feb. 17, 2022

(30) Foreign Application Priority Data

Aug. 13, 2020 (KR) .................. 10-2020-0101693

(51) Int. Cl.
*H01L 27/12* (2006.01)
*H01L 25/16* (2023.01)

(52) U.S. Cl.
CPC .......... *H01L 25/167* (2013.01); *H01L 27/124* (2013.01)

(58) Field of Classification Search
CPC ............................. H01L 25/167; H01L 27/124
See application file for complete search history.

(56) References Cited

U.S. PATENT DOCUMENTS

| 10,133,531 | B2 | 11/2018 | Yoshitani et al. | |
| 2018/0019377 | A1* | 1/2018 | Kim ........................ | H01L 33/38 |
| 2019/0102136 | A1 | 4/2019 | Yoshitani et al. | |
| 2019/0244985 | A1* | 8/2019 | Kim ....................... | H01L 27/124 |
| 2021/0343784 | A1 | 11/2021 | Kwag et al. | |
| 2021/0375194 | A1 | 12/2021 | Kwag et al. | |

FOREIGN PATENT DOCUMENTS

| JP | 2011086865 A * | 4/2011 | ............. H01L 24/95 |
| KR | 10-2020-0010701 | 1/2020 | |
| KR | 10-2020-0042075 | 4/2020 | |
| KR | 10-2020-0042997 | 4/2020 | |
| KR | 10-2020-0085977 | 7/2020 | |
| KR | 10-2020-0088962 | 7/2020 | |
| KR | 10-2021-0132255 | 11/2021 | |
| WO | WO-2011108309 A1 * | 9/2011 | ......... H01L 25/0753 |

OTHER PUBLICATIONS

International Search Report corresponding to International Application No. PCT/KR2021/010684 dated Nov. 26, 2021.
Written Opinion corresponding to International Application No. PCT/KR2021/010684 dated Nov. 26, 2021.

* cited by examiner

*Primary Examiner* — James A Dudek
(74) *Attorney, Agent, or Firm* — Kile Park Reed & Houtteman PLLC

(57) ABSTRACT

A display device comprises an emission area and a sub area disposed on a side of the emission area and spaced apart from the emission area, electrodes disposed in the emission area and spaced apart from each other in a first direction and a second direction intersecting the first direction, the electrodes extending in the second direction, and light emitting elements having ends disposed on the electrodes spaced apart in the first direction. The emission area comprises a first area where some of the electrodes are spaced apart from each other in the second direction, and first dummy patterns disposed in the first area and spaced apart from the electrodes in the second direction.

20 Claims, 17 Drawing Sheets

DISPLAY DEVICE

CROSS-REFERENCE TO RELATED APPLICATION(S)

This application claims priority to and benefits of Korean Patent Application No. 10-2020-0101693 under 35 U.S.C. § 119 filed on Aug. 13, 2020 in the Korean Intellectual Property Office, the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and may include a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an inorganic light emitting element display device which may prevent a short circuit between the electrodes by a residue.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include an emission area and a sub area disposed on a side of the emission area and spaced apart from the emission area; a plurality of electrodes disposed in the emission area and spaced apart from each other in a first direction and a second direction intersecting the first direction, the plurality of electrodes extending in the second direction; and a plurality of light emitting elements having ends disposed on the plurality of electrodes spaced apart in the first direction, wherein the emission area may include a first area where some of electrodes are spaced apart from each other in the second direction; and a plurality of first dummy patterns disposed in the first area and spaced apart from the plurality of electrodes in the second direction.

A vertical distance in the first direction between the plurality of first dummy patterns may be greater than a gap between the plurality of electrodes spaced apart in the first direction.

The vertical distance in the first direction between the plurality of first dummy patterns may be greater than a length of each of the plurality of light emitting elements.

Each of the plurality of first dummy patterns may be spaced apart in the first direction from an imaginary line extending from sides of the plurality of electrodes disposed side by side in the second direction.

The plurality of first dummy patterns may not be disposed side by side with each other in the first direction.

A number of the plurality of electrodes may be disposed in the sub area and spaced apart from other electrodes of the plurality of electrodes in the second direction, and the plurality of first dummy patterns may be not disposed in a second area where some of the plurality of electrodes are spaced apart from each other in the sub area.

The display device may further comprise a first insulating layer disposed on the plurality of electrodes and insulating patterns disposed on the plurality of first dummy patterns.

The plurality of electrodes may comprise a first electrode; a second electrode spaced apart from the first electrode in the first direction; a third electrode disposed between the first electrode and the second electrode; a fourth electrode spaced apart from the second electrode in the first direction; a fifth electrode spaced apart from the first electrode in the second direction; a sixth electrode spaced apart from the second electrode in the second direction; a seventh electrode spaced apart from the third electrode in the second direction; and an eighth electrode spaced apart from the fourth electrode in the second direction.

The display device may further comprise a first contact electrode disposed on the first electrode and electrically contacting a number of the plurality of light emitting elements; a second contact electrode disposed on the second electrode and electrically contacting a number of the plurality of light emitting elements; and a third contact electrode disposed on the third electrode and the fifth electrode and comprising a first connecting part extending in the first direction in the first area, wherein the plurality of first dummy patterns may not overlap the first contact electrode, the second contact electrode, and the third contact electrode.

The display device may further comprise a second dummy pattern overlapping the third contact electrode and directly contacting the third contact electrode.

The display device may further comprise a fourth contact electrode disposed on the seventh electrode and the eighth electrode of the plurality of electrodes and comprising a second connecting part extending in the first direction in an area other than the first area; a fifth contact electrode disposed on the fourth electrode and the sixth electrode of the plurality of electrodes and comprising a third connecting part extending in the first direction in the first area; and a third dummy pattern overlapping one of the first contact electrode, the second contact electrode and the fourth contact electrode, the third dummy pattern not directly contacting a corresponding contact electrode.

The display device may further comprise at least one fourth dummy pattern directly connected to one of the first electrode, the second electrode, the third electrode, the fourth electrode, the fifth electrode, the sixth electrode, the seventh electrode, and the eighth electrode of the plurality of electrodes.

The display device may further comprise at least one fifth dummy pattern having a length in the second direction greater than a length of each of the plurality of first dummy patterns.

The display device may further comprise at least one sixth dummy pattern having a width in the first direction greater than a width of each of the plurality of first dummy patterns.

According to an embodiment, a display device may include a first electrode group comprising a plurality of electrodes spaced apart in a first direction and extending in a second direction intersecting the first direction; a second electrode group spaced apart from the first electrode group in the second direction and comprising a plurality of electrodes; a plurality of light emitting elements disposed on the electrodes spaced apart in the first direction of the first electrode group; a plurality of contact electrodes, each of the plurality of contact electrodes electrically contacting at least one of the electrodes of the first electrode group and the second electrode group and a number of the plurality of light emitting elements; and a plurality of dummy patterns disposed in a first area between the first electrode group and the second electrode group, wherein a vertical distance in the first direction between the different dummy patterns of the plurality of dummy patterns may be greater than a gap between the electrodes spaced apart in the first direction of the first electrode group.

The plurality of dummy patterns may comprise a first dummy pattern spaced apart from the electrodes of the first electrode group and the second electrode group in the second direction, and the first dummy pattern may not overlap the plurality of contact electrodes.

The plurality of contact electrodes may comprise a plurality of first contact electrodes, each of the plurality of first contact electrodes being disposed on one of the plurality of electrodes of the first electrode group and the second electrode group; and a plurality of second contact electrodes, each of the plurality of second contact electrodes being disposed on two or more of the plurality of electrodes of the first electrode group and the second electrode group, and the plurality of dummy patterns may comprise a second dummy pattern directly contacting each of the second contact electrodes; and a third dummy pattern overlapping one of the plurality of contact electrodes, the third dummy pattern not contacting a corresponding contact electrode of the plurality of contact electrodes.

At least one of the plurality of dummy patterns is directly connected to one of the plurality of electrodes of the first electrode group and the second electrode group.

A length of at least one of the plurality of dummy patterns in the second direction may be greater than a length of the first dummy pattern.

A width of at least one of the plurality of dummy patterns in the first direction may be greater than a width of the first dummy pattern.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
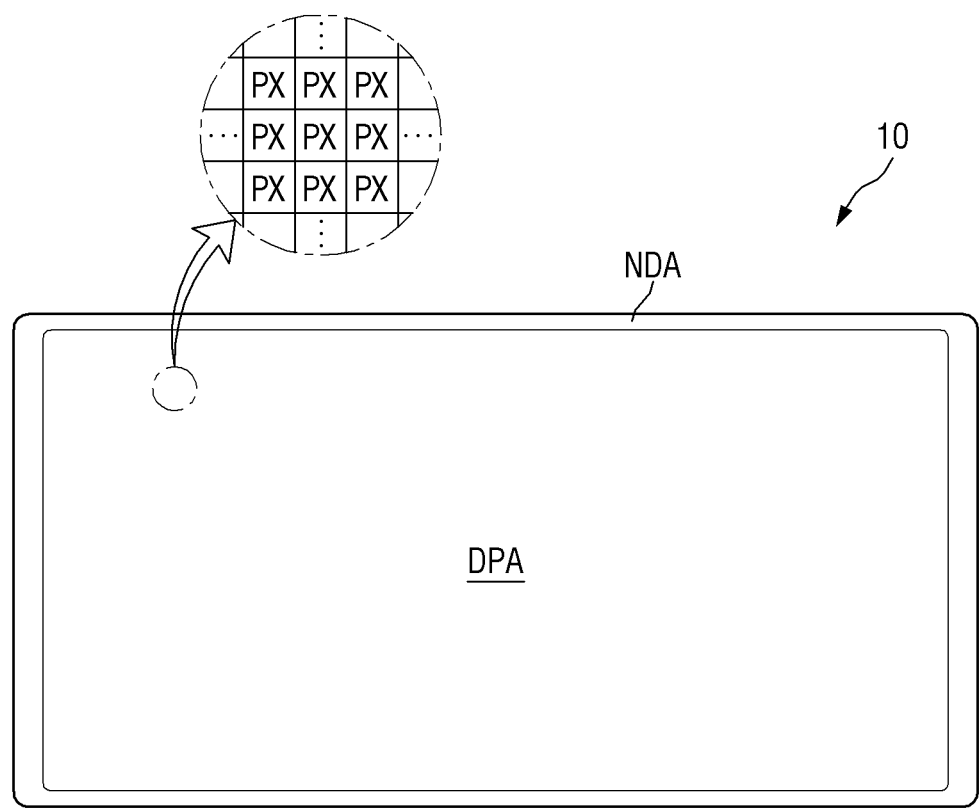
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The drawings attached to the specification are provided to explain the disclosure, and the shapes and elements shown in the drawings may be exaggerated and displayed for clarity to help understanding of the disclosure, and thus the disclosure is not limited to the drawings.

In the disclosure, it will be understood that when an element or layer is referred to as being "on", "connected to" or "coupled to" another element or layer, it can be directly on, connected or coupled to the other element or layer or intervening elements or layers may be present.

It will also be understood that when a layer is referred to as being "on" another layer or substrate, it can be directly on the other layer or substrate, or intervening layers may also be present. The same reference numbers indicate the same components throughout the specification.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification, it is to be understood that the terms such as "comprising" or "including" or "having" and their variations are intended to indicate the existence of the features or components disclosed in the specification, and are not intended to preclude the possibility that one or more other features or components may be added.

It will be understood that when a layer, region, or component is referred to as being "formed on" or "disposed on" or "arranged on" or "located on" or "provided on" another layer, region, or component, it may be directly or indirectly formed or disposed on or arranged on or located on or provided on the other layer, region, or component. That is, for example, intervening layers, regions, or components may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the attached drawings.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 may include a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels may also be applied as long as the same technical spirit is applicable.

The shape of the display device 10 may be variously modified. For example, the display device 10 may have various shapes such as a substantially horizontally long rectangle, a substantially vertically long rectangle, substantially a square, substantially a quadrangle with substantially rounded corners (vertices), other polygons, and substantially a circle. The shape of a display area DPA of the display device 10 may also be similar to the overall shape of the display device 10. In FIG. 1, each of the display device 10 and the display area DPA may be substantially shaped like a horizontally long rectangle.

The display device 10 may include the display area DPA and a non-display area NDA. The display area DPA may be an area where a screen may be displayed, and the non-display area NDA may be an area where no screen is displayed. The display area DPA may also be referred to as an active area, and the non-display area NDA may also be referred to as an inactive area. The display area DPA may generally occupy a center of the display device 10.

The display area DPA may include a plurality of pixels PX. The pixels PX may be arranged or disposed in a matrix direction. Each of the pixels PX may be substantially rectangular or substantially square in a plan view. However, the disclosure is not limited thereto, and each of the pixels PX may also have a substantially rhombic planar shape having each side inclined with respect to a direction. The pixels PX may be alternately arranged or disposed in a stripe or PenTile® type. For example, each of the pixels PX may include one or more light emitting elements ED which emit light of a specific or predetermined wavelength band to display a specific or predetermined color.

The non-display area NDA may be disposed around the display area DPA. The non-display area NDA may entirely or partially surround or may be adjacent to the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
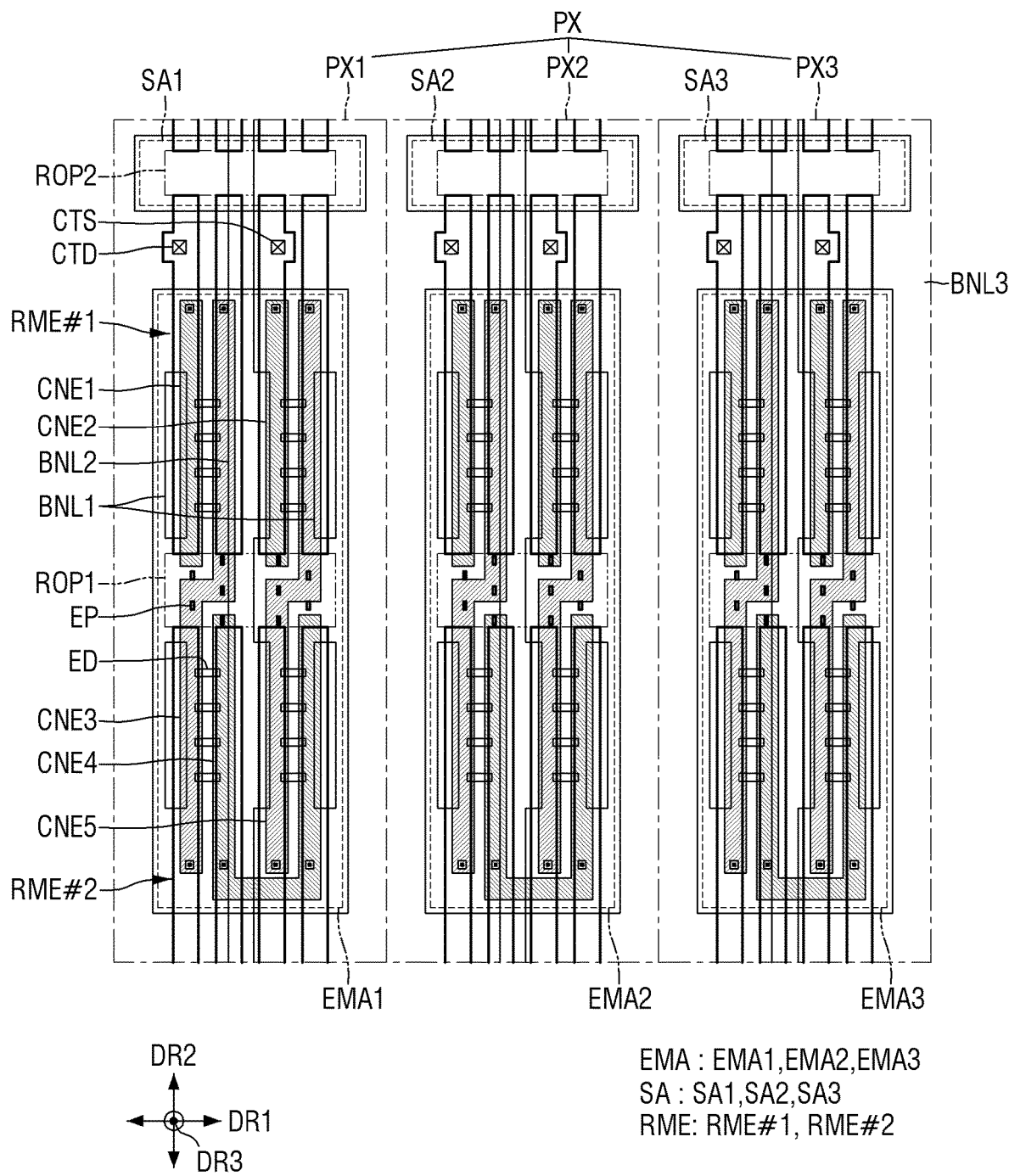
FIG. 2 is a plan view of a pixel of the display device according to an embodiment.

FIG. 2 is a plan view of a pixel PX of the display device 10 according to an embodiment.

Referring to FIG. 2, each of the pixels PX of the display device 10 may include a plurality of subpixels PXn (where n is an integer of 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. However, the disclosure is not limited thereto, and the subpixels PXn may also emit light of the same color. For example, although the pixel PX may include three subpixels PXn in FIG. 2, the disclosure is not limited thereto, and the pixel PX may also include a larger number of subpixels PXn.

One pixel PX of the display device 10 may include a plurality of emission areas EMA, and each subpixel PXn may include an emission area EMA and a non-emission area (not illustrated). The emission area EMA may be an area in which light emitting elements ED (see FIG. 6) may be disposed to emit light of a specific or predetermined wavelength band, and the non-emission area may be an area in which the light emitting elements ED may not be disposed and from which no light may be output because light emitted from the light emitting elements ED may not reach this area. The emission area EMA may include an area in which the light emitting elements ED may be disposed and an area which may be adjacent to the light emitting elements ED and to which light emitted from the light emitting elements ED may be output.

However, the emission area EMA may also include an area from which light emitted from the light emitting elements ED may be output after being reflected or refracted by other members. A plurality of light emitting elements ED may be disposed in each subpixel PXn, and an area where the light emitting elements ED may be disposed and an area adjacent to this area may form the emission area EMA.

A first emission area EMA1 of the pixel PX is disposed in the first subpixel PX1, a second emission area EMA2 is disposed in the second subpixel PX2, and a third emission area EMA3 is disposed in the third subpixel PX3. The subpixels PXn include different types of light emitting elements ED so that light of different colors may be emitted from the first through third emission areas EMA (EMA1 through EMA3). For example, the first subpixel PX1 may emit light of the first color, the second subpixel PX2 may emit light of the second color, and the third subpixel PX3 may emit light of the third color. The first color may be blue, the second color may be green, and the third color may be red. However, the disclosure is not limited thereto, and the subpixels PXn may also include the same type of light emitting elements ED so that light of the same color is emitted from the emission areas EMA or one pixel PX.

For example, each subpixel PXn of the pixel PX may include a sub area SA which is a part of the non-emission area and spaced apart from the emission area EMA. The sub areas SA may include a first sub area SA1 of the first subpixel PX1, a second sub area SA2 of the second subpixel PX2, and a third sub area SA3 of the third subpixel PX3. The sub area SA may be disposed on a side of the emission area EMA of each subpixel PXn in a second direction DR2 and may be disposed between the emission areas EMA of subpixels PXn neighboring in the second direction DR2. For example, in each subpixel PXn, the sub area SA may be disposed on an upper side of the emission area EMA which is a side of the second direction DR2, and the emission areas EMA of the first through third subpixels PX1 through PX3 may be arranged or disposed side by side with each other in a first direction DR1. Similarly, the first sub area SA1, the second sub area SA2, and the third sub area SA3 may be arranged or disposed side by side with each other in the first direction DR1.

Light may not exit from the sub area SA because the light emitting elements ED may not be disposed in the sub area SA, but parts of electrodes RME disposed in each subpixel PXn may be disposed in the sub area SA. Some or a number of the electrodes RME disposed in each subpixel PXn may be separated in the sub area SA.

A third bank BNL3 may include parts extending in the first direction DR1 and the second direction DR2 in a plan view to form a lattice pattern over the entire display area DPA. The third bank BNL3 may be disposed at the boundary of each subpixel PXn to separate neighboring subpixels PXn. For example, the third bank BNL3 may surround the emission area EMA and the sub area SA disposed in each subpixel PXn to separate them from each other.

Figure 3:
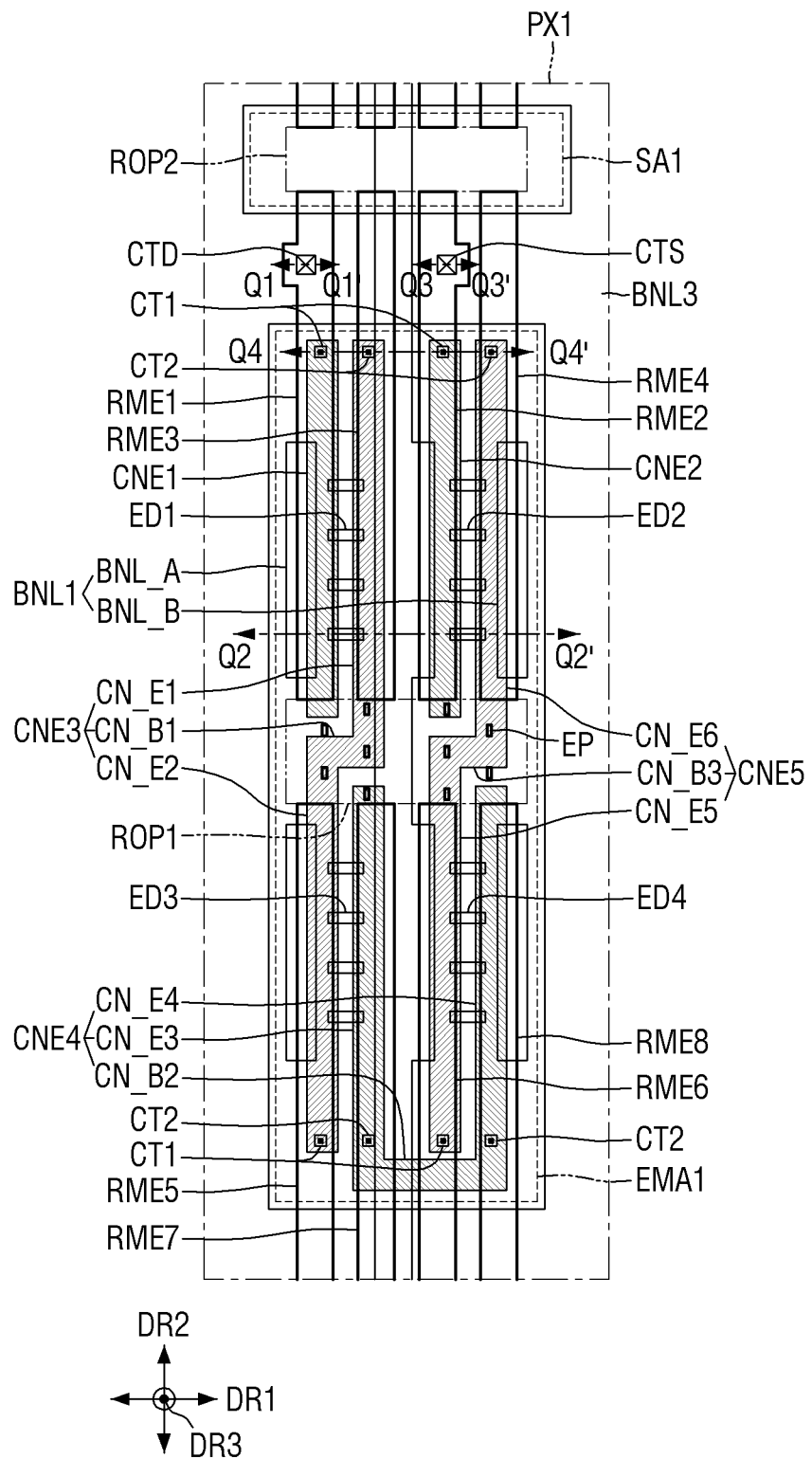
FIG. 3 is a plan view of a first subpixel of FIG. 2.
Figure 4:
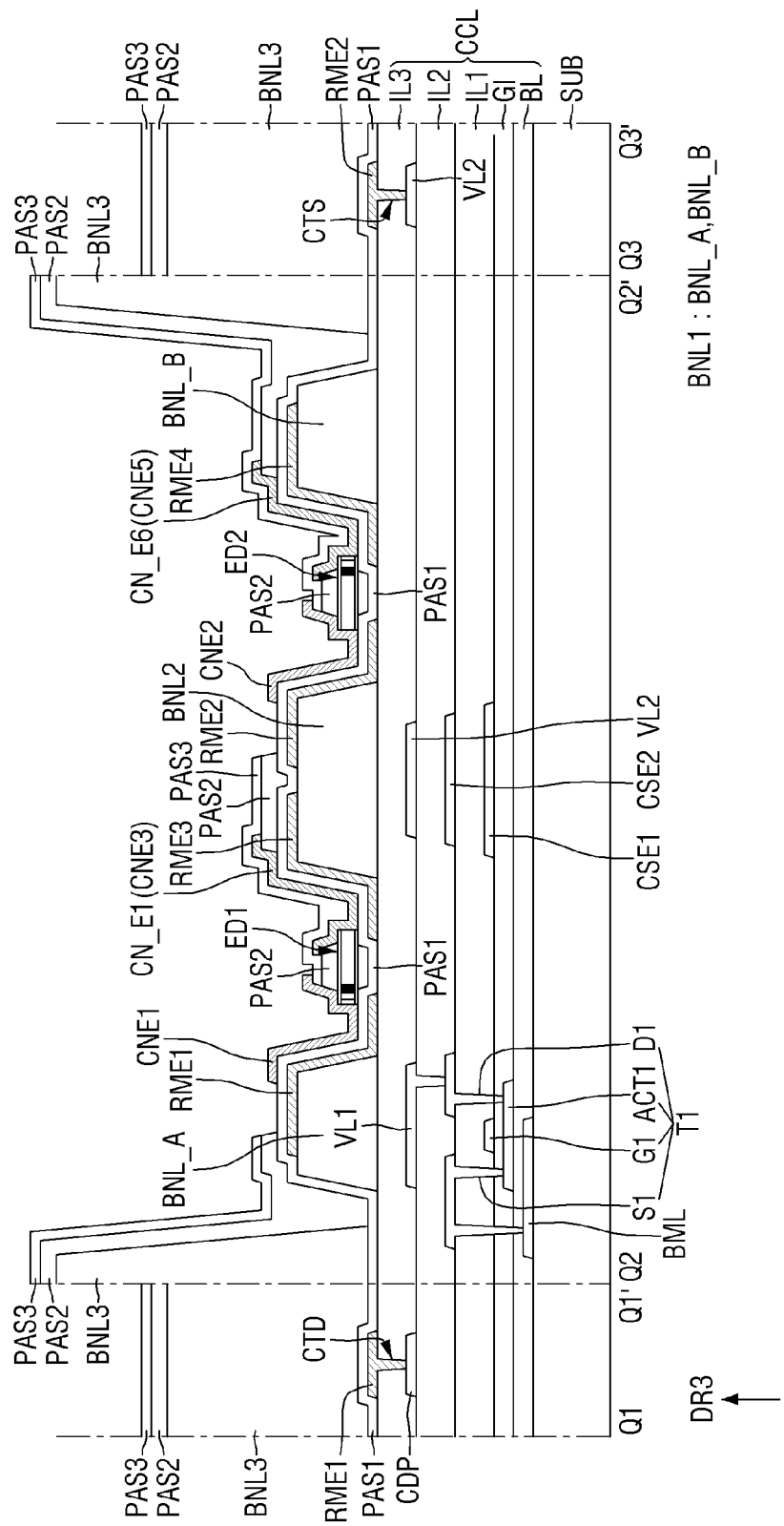
FIG. 4 is a schematic cross-sectional view taken along lines Q1-Q1', Q2-Q2', and Q3-Q3' of FIG. 3.
Figure 5:
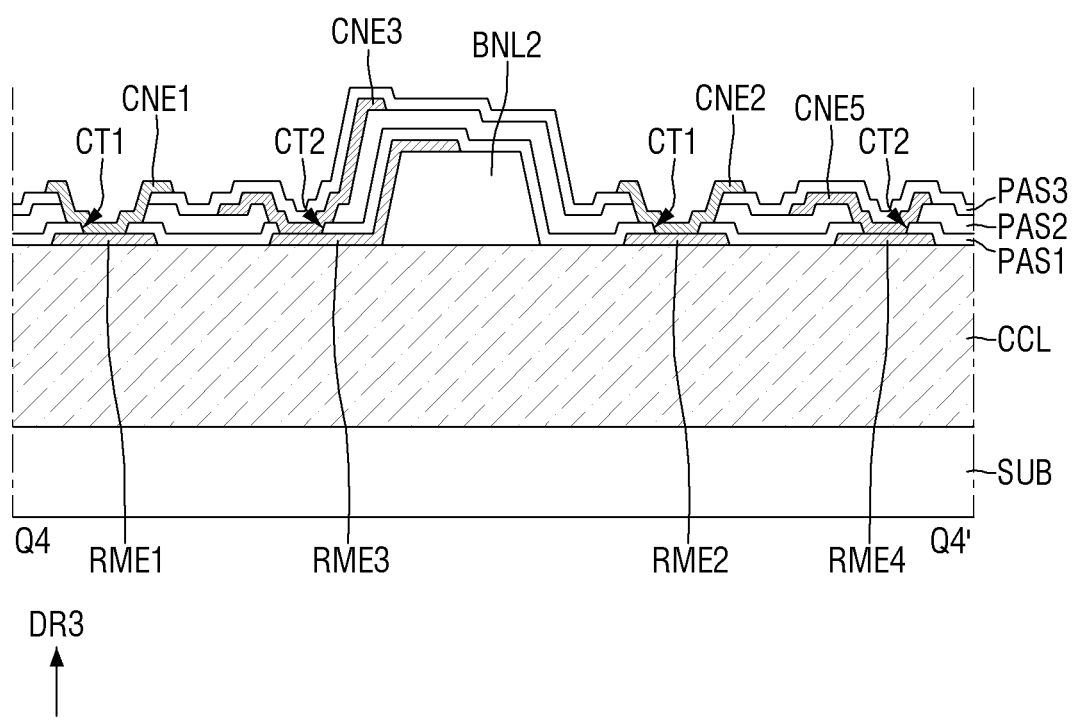
FIG. 5 is a schematic cross-sectional view taken along line Q4-Q4' of FIG. 3.

FIG. 3 is a plan view of the first subpixel PX1 of FIG. 2. FIG. 4 is a schematic cross-sectional view taken along lines Q1-Q1', Q2-Q2', and Q3-Q3' of FIG. 3. FIG. 5 is a schematic cross-sectional view taken along line Q4-Q4' of FIG. 3. FIG. 4 illustrates a cross section across both ends of the light emitting elements ED disposed in a subpixel PXn. FIG. 5 illustrates a cross section across a plurality of contact holes CT1 and CT2 formed in the subpixel PXn.

Referring to FIGS. 3 through 5 in conjunction with FIG. 2, the display device 10 may include a first substrate SUB and a circuit layer CCL and a display element layer disposed on the first substrate SUB. In the display element layer, a plurality of electrodes RME and a plurality of contact electrodes CNE as well as the light emitting elements ED may be disposed. The circuit layer CCL may include a plurality of wirings as well as circuit elements for causing the light emitting elements ED to emit light.

The first substrate SUB may be an insulating substrate. The first substrate SUB may be made of an insulating material such as glass, quartz, or polymer resin. For example, the first substrate SUB may be a rigid substrate, but may also be a flexible substrate that may be bent, folded, rolled, etc., within the spirit and the scope of the disclosure.

A first conductive layer is disposed on the first substrate SUB. The first conductive layer may include a bottom metal layer BML, and the bottom metal layer BML is overlapped by an active layer ACT1 of a first transistor T1 which will be described later. The bottom metal layer BML may include a light blocking material to prevent light from entering the active layer ACT1 of the first transistor T1. For example, the bottom metal layer BML may be made of an opaque metal material that blocks transmission of light. However, the disclosure is not limited thereto. In some cases, the bottom metal layer BML may be omitted.

A buffer layer BL may be entirely disposed on the first substrate SUB to cover or overlap the first conductive layer. The buffer layer BL may be formed on the first substrate SUB to protect the first transistor T1 from moisture introduced through the first substrate SUB which is vulnerable to moisture penetration and may perform a surface planarization function.

A semiconductor layer is disposed on the buffer layer BL. The semiconductor layer may include the first active layer ACT1 of the first transistor T1. In an embodiment, the semiconductor layer may include polycrystalline silicon, monocrystalline silicon, an oxide semiconductor, or the like within the spirit and the scope of the disclosure. The polycrystalline silicon may be formed by crystallizing amorphous silicon. In a case that the semiconductor layer may include an oxide semiconductor, the first active layer ACT1 may include a plurality of conducting regions and a channel region disposed between them. The oxide semiconductor may be an oxide semiconductor containing indium (In). In an embodiment, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

In an embodiment, the semiconductor layer may include polycrystalline silicon. The polycrystalline silicon may be formed by crystallizing amorphous silicon. In this case, each of the conducting regions of the first active layer ACT1 may be, but is not limited to, a doping region doped with impurities.

A first gate insulating layer GI is disposed on the semiconductor layer and the buffer layer BL. The first gate insulating layer GI may be disposed to cover or overlap upper surfaces of the semiconductor layer and the buffer layer BL. The first gate insulating layer GI may function as a gate insulating film of each transistor.

A second conductive layer is disposed on the first gate insulating layer GI. The second conductive layer may include a first gate electrode G1 of the first transistor T1 and a first capacitive electrode CSE1 of a storage capacitor. For example, although not illustrated in the drawings, the second conductive layer may further include a plurality of scan lines electrically connected to each subpixel PXn. The first gate electrode G1 of the second conductive layer may partially overlap the first active layer ACT1 of the first transistor T1. The first capacitive electrode CSE1 of the storage capacitor may be overlapped by a second capacitive electrode CSE2 which will be described later.

A first interlayer insulating layer IL1 is disposed on the second conductive layer. The first interlayer insulating layer IL1 may cover or overlap the second conductive layer to protect the second conductive layer.

A third conductive layer is disposed on the first interlayer insulating layer IL1. The third conductive layer may include a first source electrode S1 and a first drain electrode D1 of the first transistor T1 and the second capacitive electrode CSE2 of the storage capacitor. For example, although not illustrated in the drawings, the third conductive layer may further include a plurality of data lines electrically connected to each subpixel PXn.

The first source electrode S1 and the first drain electrode D1 of the first transistor T1 partially overlap the first active layer ACT1. Each of the first source electrode S1 and the first drain electrode D1 may contact the first active layer ACT1 through a contact hole penetrating the first interlayer insulating layer IL1 and the first gate insulating layer GI. For example, the first source electrode S1 may contact the bottom metal layer BML through a contact hole penetrating the first interlayer insulating layer IL1, the first gate insulating layer GI, and the buffer layer BL. The first drain electrode D1 may be electrically connected to a first voltage wiring VL1 which will be described later, and the first source electrode S1 may be electrically connected to a first conductive pattern CDP which may be electrically connected to a first electrode RME1.

A second interlayer insulating layer IL2 is disposed on the third conductive layer. The second interlayer insulating layer IL2 may function as an insulating film between the third conductive layer and other layers disposed on the third conductive layer. For example, the second interlayer insulating layer IL2 may cover or overlap the third conductive layer and protect the third conductive layer. The second interlayer insulating layer IL2 may also perform a surface planarization function.

A fourth conductive layer is disposed on the second interlayer insulating layer IL2. The fourth conductive layer may include the first voltage wiring VL1, a second voltage wiring VL2, and the first conductive pattern CDP.

A high potential voltage (or a first power supply voltage) supplied to the first transistor T1 may be applied to the first voltage wiring VL1, and a low potential voltage (or a second power supply voltage) supplied to a second electrode RME2 may be applied to the second voltage wiring VL2.

The first voltage wiring VL1 and the second voltage wiring VL2 may extend in the second direction DR2. The first voltage wiring VL1 and the second voltage wiring VL2 may be disposed at positions partially overlapping the electrodes RME in a thickness direction. The first voltage wiring VL1 and the second voltage wiring VL2 may cross the emission area EMA.

The first conductive pattern CDP may be electrically connected to the first source electrode S1. The first conductive pattern CDP may also contact the first electrode RME1 to be described later, and the first transistor T1 may send the first power supply voltage received from the first voltage wiring VL1 to the first electrode RME1 through the first conductive pattern CDP. Although the fourth conductive layer may include one first voltage wiring VL1 and one second voltage wiring VL2 in the drawings, the disclosure is not limited thereto. The fourth conductive layer may also include a larger number of first voltage wirings VL1 and second voltage wirings VL2.

Each of the first through fourth conductive layers may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

For example, each of the buffer layer BL, the first gate insulating layer GI, the first interlayer insulating layer IL1, and the second interlayer insulating layer IL2 described above may be a single layer or may be composed of a plurality of inorganic layers in which a plurality of layers may be stacked or alternately stacked. For example, each of the buffer layer BL, the first gate insulating layer GI, the first interlayer insulating layer IL1, and the second interlayer insulating layer IL2 may be an inorganic layer including at least any one of silicon oxide ($SiO_x$), silicon nitride ($SiN_x$) and silicon oxynitride ($SiO_xN_y$), a multilayer in which such inorganic layers may be alternately stacked, or a double layer in which silicon oxide ($SiO_x$) and silicon nitride ($SiN_x$) may be sequentially stacked.

A third interlayer insulating layer IL3 is disposed on the fourth conductive layer. The third interlayer insulating layer IL3 may include an organic insulating material to planarize a step formed by the conductive layers disposed under or below the third interlayer insulating layer IL3. For example, the third interlayer insulating layer IL3 may include an organic material such as polyimide (PI) and perform a surface planarization function.

A plurality of first banks BNL1, a second bank BNL2, the electrodes RME, the light emitting elements ED, the third bank BNL3, and the contact electrodes CNE may be disposed on the third interlayer insulating layer IL3. For example, a plurality of insulating layers PAS1 and PAS2 may be further disposed on the third interlayer insulating layer IL3.

The first and second banks BNL1 and BNL2 may be directly disposed on the third interlayer insulating layer IL3.

In each subpixel PXn, a plurality of first banks BNL1 and one second bank BNL2 spaced apart from the first banks BNL1 and disposed between the first banks BNL1 may be disposed. The light emitting elements ED may be disposed between the first and second banks BNL1 and BNL2 spaced apart from each other in the first direction DR1.

The first banks BNL1 may be disposed in the emission area EMA of each subpixel PXn and spaced apart from each other. For example, the first banks BNL1 may include a plurality of sub banks BNL_A and BNL_B spaced apart from each other in the first direction DR1 in each emission area EMA. First sub banks BNL_A may be disposed on a left side of a center of each emission area EMA, and second sub banks BNL_B may be disposed on a right side of the center of each emission area EMA. The sub banks BNL_A and BNL_B may extend in the second direction DR2, but their lengths may be smaller than a length, in the second direction DR2, of an opening area surrounded by the third bank BNL3. In one subpixel PXn, two first sub banks BNL_A and two second sub banks BNL_B may be disposed and spaced apart from each other in the second direction DR2. The first banks BNL1 may form island-shaped or isolated-shaped patterns extending in one or a direction in the entire display area DPA.

The second bank BNL2 may be disposed between the first banks BNL1 spaced apart from each other in the first direction DR1. The second bank BNL2 may extend in the second direction DR2 and may be formed such that a part disposed in the emission area EMA may include portions having a large width. For example, the second bank BNL2 may have a large width in parts facing the first banks BNL1 and may extend in the second direction DR2 between the first and second sub banks BNL_A and BNL_B. Different from the first banks BNL1, the second bank BNL2 may extend beyond the emission area EMA to the sub area SA. The second bank BNL2 may be disposed in a plurality of subpixels PXn neighboring in the second direction DR2 to form a linear pattern in the display area DPA.

At least a part of each of the first and second banks BNL1 and BNL2 may protrude from an upper surface of the third interlayer insulating layer IL3. The protruding part of each of the first and second banks BNL1 and BNL2 may have inclined side surfaces, and light emitted from the light emitting elements ED may be reflected by the electrodes RME disposed on the first and second banks BNL1 and BNL2 to travel toward above the third interlayer insulating layer IL3. The first and second banks BNL1 and BNL2 may provide an area where the light emitting elements ED may be disposed while functioning as reflective barriers that reflect light emitted from the light emitting elements ED in an upward direction. For example, a layer including a material having high reflectivity may be further disposed on the first and second banks BNL1 and BNL2 and may reflect light emitted from the light emitting elements ED. The side surfaces of the first and second banks BNL1 and BNL2 may be inclined in a substantially linear shape. However, the disclosure is not limited thereto, and each of the first and second banks BNL1 and BNL2 may also be shaped substantially like a semi-circle or substantially a semi-ellipse with a substantially curved outer surface. The first and second banks BNL1 and BNL2 may include, but are not limited to, an organic insulating material such as polyimide (PI).

The electrodes RME extend in one direction and may be disposed in each subpixel PXn. For example, the electrodes RME may extend in the second direction DR2 and may be spaced apart from each other in the first direction DR1 and the second direction DR2 in each subpixel PXn. In an embodiment, the electrodes RME may be divided into electrode groups RME#1 and RME#2, each including a plurality of electrodes disposed side by side in the first direction DR1 and spaced apart from each other. The electrode groups RME#1 and RME#2 may be spaced apart from each other in the second direction DR2.

For example, one subpixel PXn may include a first electrode group RME#1 and a second electrode group RME#2 spaced apart from each other in the second direction DR2. The first electrode group RME#1 may be disposed on an upper side of the center of the emission area EMA which is a side of the second direction DR2, and the second electrode group RME#2 may be spaced apart from the first electrode group RME#1 in the second direction DR2 and disposed on a lower side of the emission area EMA. The first electrode group RME#1 and the second electrode group RME#2 of the subpixel PXn may be spaced apart from each other by a first area ROP1 located or disposed in the emission area EMA.

For example, the electrodes RME of the first electrode group RME#1 may extend beyond the third bank BNL3 to a part of the sub area SA in the subpixel PXn, and the electrodes RME of the second electrode group RME#2 may extend beyond the third bank BNL3 to a part of the sub area SA of another subpixel PXn. For example, the first electrode group RME#1 and the second electrode group RME#2 of different subpixels PXn may be disposed in the sub area SA and spaced apart from each other. The first electrode group RME#1 and the second electrode group RME#2 of different subpixels PXn may be spaced apart from each other by a second area ROP2 located or disposed in the sub area SA of any one subpixel PXn.

The electrodes RME of different electrode groups RME#1 and RME#2 may be disposed side by side and spaced apart in the second direction DR2. For example, any one electrode belonging to the first electrode group RME#1 may be disposed side by side in the second direction DR2 with any one electrode belonging to the second electrode group RME#2. This arrangement of the electrodes RME may be obtained by forming electrode lines RM (see FIG. 9) extending in the second direction DR2 and then separating the electrode lines RM in a subsequent process after the light emitting elements ED may be placed. The electrode lines RM may be utilized to generate an electric field in each subpixel PXn to align the light emitting elements ED during a process of manufacturing the display device 10. The light emitting elements ED may be aligned on the electrodes RME by a dielectrophoretic force due to the electric field generated on the electrode lines RM. After the light emitting elements ED may be aligned, the electrode lines RM may be separated in the first area ROP1 and the second area ROP2 to form the electrode groups RME#1 and RME#2 spaced apart from each other in the second direction DR2.

The display device 10 according to an embodiment may further include a plurality of dummy patterns EP disposed in the first area ROP1 that separates the first electrode group RME#1 and the second electrode group RME#2. The dummy patterns EP may be spaced apart from each other in the first direction DR1 or the second direction DR2 within the first area ROP1. The dummy patterns EP may be formed in the process of patterning and separating the electrode lines RM during the manufacturing process of the display device 10. This will be described in more detail later.

As for the electrodes included in each electrode group RME#1 or RME#2, the first electrode group RME#1 may include the first electrode RME1, the second electrode RME2, a third electrode RME3, and a fourth electrode RME4. The second electrode group RME#2 may include a fifth electrode RME5, a sixth electrode RME6, a seventh electrode RME7, and an eighth electrode RME8. The electrodes RME disposed in each subpixel PXn may respectively be disposed on the first banks BNL1 or the second bank BNL2 spaced apart from each other.

The first electrode RME1 may be disposed on an upper left side of the center of the emission area EMA. A part of the first electrode RME1 is disposed on a first sub bank BNL_A disposed on the upper side of the emission area EMA. The second electrode RME2 may be spaced part from the first electrode RME1 in the first direction DR1 and may be disposed adjacent to the center of the emission area EMA. A part of the second electrode RME2 may be disposed on a side of the second bank BNL2 which faces a second sub bank BNL_B.

Each of the first electrode RME1 and the second electrode RME2 may be a first type electrode electrically connected to the fourth conductive layer disposed under or below the electrode. The first electrode RME1 and the second electrode RME2 may be directly electrically connected to the fourth conductive layer through electrode contact holes CTD and CTS formed in parts overlapping the third bank BNL3. For example, the first electrode RME1 may contact the first conductive pattern CDP through a first electrode contact hole CTD penetrating the third interlayer insulating layer IL3 disposed under or below the first electrode RME1. The second electrode RME2 may contact the second voltage wiring VL2 through a second electrode contact hole CTS penetrating the third interlayer insulating layer IL3 disposed under or below the second electrode RME2. The first electrode RME1 may be electrically connected to the first transistor T1 through the first conductive pattern CDP to receive the first power supply voltage, and the second electrode RME2 may be electrically connected to the second voltage wiring VL2 to receive the second power supply voltage. Since the first electrode RME1 and the second electrode RME2 may be disposed separately for each subpixel PXn, the light emitting elements ED of different subpixels PXn may emit light individually. Although the first electrode contact hole CTD and the second electrode contact hole CTS may be formed at positions overlapping the third bank BNL3 in the drawings, the disclosure is not limited thereto. For example, the electrode contact holes CTD and CTS may also be located or disposed in the emission area EMA surrounded by the third bank BNL3.

The third electrode RME3 may be disposed between the first electrode RME1 and the second electrode RME2. The third electrode RME3 may be spaced apart from the first electrode RME1 to face the first electrode RME1 and may be spaced apart from the second electrode RME2 on the second bank BNL2. A part of the third electrode RME3 may be disposed on the other side of the second bank BNL2 which may face the first sub bank BNL_A located or disposed on the upper side of the emission area EMA. The fourth electrode RME4 may be spaced apart from the second electrode RME2 in the first direction DR1. The fourth electrode RME4 may face the second electrode RME2 and may be disposed on an upper right side of the center of the emission area EMA. A part of the fourth electrode RME4 may be disposed on a side, which may face the second bank BNL2, of the second sub bank BNL_B disposed on the upper side.

The fifth electrode RME5 may be disposed on a lower left side of the center of the emission area EMA. The fifth electrode RME5 may be spaced apart from the first electrode RME1 in the second direction DR2, and a part of the fifth electrode RME5 is disposed on a side of a first sub bank BNL_A disposed on the lower side of the emission area EMA. The sixth electrode RME6 may be spaced apart from the fifth electrode RME5 in the first direction DR1 and may be disposed adjacent to the center of the emission area EMA and spaced apart from the second electrode RME2 in the second direction DR2. A part of the sixth electrode RME6 may be disposed on a side of the second bank BNL2 which faces a second sub bank BNL_B located or disposed on the lower side of the emission area EMA.

The seventh electrode RME7 may be disposed between the fifth electrode RME5 and the sixth electrode RME6. The seventh electrode RME7 may be spaced apart from the fifth electrode RME5 to face the fifth electrode RME5 and may be spaced apart from the sixth electrode RME6 on the second bank BNL2. A part of the seventh electrode RME7 may be disposed on the other side of the second bank BNL2 which faces the first sub bank BNL_A located or disposed on the lower side of the emission area EMA. The eighth electrode RME8 may be spaced apart from the sixth electrode RME6 in the first direction DR1. The eighth electrode RME8 may face the sixth electrode RME6 and may be disposed on a lower right side of the center of the emission area EMA and spaced part from the fourth electrode RME4 in the second direction DR2. A part of the eighth electrode RME8 may be disposed on a side, which faces the second bank BNL2, of the second sub bank BNL_B disposed on the lower side.

Each of the third through eighth electrodes RME3 through RME8 may be a second type electrode not directly electrically connected to the fourth conductive layer disposed under or below the electrode, different from the first type electrode. The second type electrode may receive an electrical signal, which is directly transmitted to the first type electrode, through the light emitting elements ED or a contact electrode CNE. Although the third through eighth electrodes RME3 through RME8 may not be directly electrically connected to the fourth conductive layer disposed under or below them, an electrical signal transmitted from the fourth conductive layer may be transmitted to the third through eighth electrodes RME3 through RME8 so that the third through eighth electrodes RME3 through RME8 are not floating.

In an embodiment, a width of each electrode RME measured in the first direction DR1 may be smaller than a width of each of the first and second banks BNL1 and BNL2 measured in the first direction DR1. Each electrode RME may be disposed to cover or overlap at least one or a side surface of a first bank BNL1 or the second bank BNL2 to reflect light emitted from the light emitting elements ED. For example, a gap between the electrodes RME may be smaller than a gap between the first and second banks BNL1 and BNL2. At least a part of each electrode RME may be directly disposed on the third interlayer insulating layer IL3 so that the electrodes RME may lie in the same plane.

The electrodes RME may be electrically connected to the light emitting elements ED. The electrodes RME may be electrically connected to both ends of the light emitting elements ED through the contact electrodes CNE to be described later and may transmit an electrical signal received from the fourth conductive layer to the light emitting elements ED. An electrical signal for causing the light emitting elements ED to emit light may be directly transmitted to the first electrode RME1 and the second electrode RME2 which may be first type electrodes and may be transmitted to other electrodes through the contact electrodes CNE and the light emitting elements ED to be described later.

Each electrode RME may include a conductive material having high reflectivity. For example, each electrode RME may include a metal such as silver (Ag), copper (Cu) or aluminum (Al) as a material having high reflectivity or may be an alloy including aluminum (Al), nickel (Ni) or lanthanum (La). Each electrode RME may reflect light, which travels toward a side surface of a first bank BNL1 or the second bank BNL2 after being emitted from the light emitting elements ED, toward above each subpixel PXn.

However, the disclosure is not limited thereto, and each electrode RME may further include a transparent conductive material. For example, each electrode RME may include a material such as ITO, IZO or ITZO. In an embodiment, each electrode RME may have a structure in which a transparent conductive material and a metal layer having high reflectivity may be each stacked in one or more layers or may be formed as a single layer including them. For example, each electrode RME may have a stacked structure of ITO/Ag/ITO, ITO/Ag/IZO, or ITO/Ag/ITZO/IZO.

A first insulating layer PAS1 may be disposed on the electrodes RME, the first banks BNL1, and the second bank BNL2. The first insulating layer PAS1 may be disposed to entirely cover or overlap the electrodes RME, the first banks BNL1 and the second bank BNL2 and may protect the electrodes RME while insulating them from each other. For example, the first insulating layer PAS1 may prevent the light emitting elements ED disposed on the first insulating layer PAS1 from directly contacting other members and thus being damaged.

In an embodiment, the first insulating layer PAS1 may be stepped such that a part of an upper surface of the first insulating layer PAS1 is depressed between the electrodes RME spaced apart from each other in the first direction DR1. The light emitting elements ED may be disposed on the stepped upper surface of the first insulating layer PAS1, and a space may be formed between each of the light emitting elements ED and the first insulating layer PAS1. However, the disclosure is not limited thereto.

The first insulating layer PAS1 may include a plurality of first and second contact holes CT1 and CT2 partially exposing upper surfaces of the electrodes RME, respectively. The first and second contact electrodes CT1 and CT2 may penetrate the first insulating layer PAS1, and the contact electrodes CNE to be described later may contact the electrodes RME exposed through the contact holes first and second CT1 and CT2.

The third bank BNL3 may be disposed on the first insulating layer PAS1. The third bank BNL3 may include parts extending in the first direction DR1 and the second direction DR2 to form a lattice pattern in a plan view. The third bank BNL3 may be disposed at the boundary of each subpixel PXn to separate neighboring subpixels PXn. For example, the third bank BNL3 may surround the emission area EMA and the sub area SA disposed in each subpixel PXn to separate them from each other. Of the parts of the third bank BNL3 which extend in the second direction DR2, a part disposed between the emission areas EMA may be wider than a part disposed between the sub areas SA, and a gap between the sub areas SA may be smaller than a gap between the emission areas EMA. However, the disclosure is not limited thereto, and on the contrary, the width of the third bank BNL3 may also be changed so that the gap between the sub areas SA is greater than the gap between the emission areas EMA.

The third bank BNL3 may be formed to have a greater height than the first banks BNL1 and the second bank BNL2. The third bank BNL3 may prevent ink from overflowing to adjacent subpixels PXn in an inkjet printing process during the manufacturing process of the display device 10. Therefore, the third bank BNL3 may separate inks in which different light emitting elements ED may be dispersed for different subpixels PXn, so that the inks may not be mixed with each other. Similar to the first banks BNL1, the third bank BNL3 may include, but is not limited to, polyimide (PI).

The light emitting elements ED may be disposed on the first insulating layer PAS1. The light emitting elements ED may be spaced apart from each other along the second direction DR2 in which each electrode RME extends and may be aligned substantially parallel to each other. The light emitting elements ED may extend in a direction, and the direction in which each electrode RME extends and the direction in which the light emitting elements ED extend may be substantially perpendicular to each other. However, the disclosure is not limited thereto, and the light emitting elements ED may also extend obliquely to the direction in which each electrode RME extends.

Each light emitting element ED may include semiconductor layers doped with different conductivity types. Each light emitting element ED including the semiconductor layers may be oriented such that an end faces in a specific or predetermined direction according to the direction of an electric field generated on the electrodes RME. For example, each light emitting element ED may include a light emitting layer 36 (see FIG. 6) to emit light of a specific or predetermined wavelength band. The light emitting elements ED disposed in each subpixel PXn may emit light of different wavelength bands according to the material that forms the light emitting layer 36. However, the disclosure is not limited thereto, and the light emitting elements ED disposed in each subpixel PXn may also emit light of the same color.

Each light emitting element ED may include a plurality of layers disposed in a direction parallel to an upper surface of the first substrate SUB. The direction in which the light emitting elements ED of the display device 10 extend may be parallel to the first substrate SUB, and a plurality of semiconductor layers included in each light emitting element ED may be sequentially arranged or disposed along the direction parallel to the upper surface of the first substrate SUB. However, the disclosure is not limited thereto. In some cases, in a case that the light emitting elements ED have a different structure, the layers may be arranged or disposed in a direction perpendicular to the first substrate SUB.

The light emitting elements ED may be disposed on the electrodes RME spaced part from each other in the first direction DR1 between the first and second banks BNL1 and BNL2. A length of each light emitting element ED may be greater than the gap between the electrodes RME spaced apart from each other in the first direction DR1, and both ends of each light emitting element ED may be disposed on different electrodes RME. For example, the light emitting elements ED may include first light emitting elements ED1 having both ends disposed on the first electrode RME1 and the third electrode RME3 in the first electrode group RME#1 and second light emitting elements ED2 having both ends disposed on the second electrode RME2 and the fourth electrode RME4 in the first electrode group RME#1. For example, the light emitting elements ED may include third light emitting elements ED3 having both ends disposed on the fifth electrode RME5 and the seventh electrode RME7 in the second electrode group RME#2 and fourth light emitting elements ED4 having both ends disposed on the sixth electrode RME6 and the eighth electrode RME8.

For example, each light emitting element ED may include a plurality of semiconductor layers, and a first end and a second end opposite the first end may be defined based on any one semiconductor layer. Each light emitting element ED may be disposed such that each of the first end and the second end lies on a specific or predetermined electrode RME. For example, the first light emitting elements ED1 may be disposed such that the first ends lie on the first electrode RME1 and the second ends lie on the third electrode RME3. The second light emitting elements ED2 may be disposed such that the first ends lie on the fourth electrode RME4 and the second ends lie on the second electrode RME2. Similarly, the third light emitting elements ED3 may be disposed such that the first ends lie on the fifth electrode RME5 and the second ends lie on the seventh electrode RME7. The fourth light emitting elements ED4 may be disposed such that the first ends lie on the eighth electrode RME8 and the second ends lie on the sixth electrode RME6. The first end and the second end of each light emitting element ED may be electrically connected to different electrodes RME, respectively. However, the disclosure is not limited thereto, and the light emitting elements ED may also be disposed such that only one or an end of each light emitting element ED lies on an electrode RME according to the direction in which the light emitting elements ED may be oriented between the electrodes RME.

Both ends of each light emitting element ED may contact the contact electrodes CNE, respectively. An insulating film 38 (see FIG. 6) may not be formed on end surfaces of each light emitting element ED in the extending direction of the light emitting element ED, thereby partially exposing the semiconductor layers. The exposed semiconductor layers may contact the contact electrodes CNE. However, the disclosure is not limited thereto. In some cases, at least a part of the insulating film 38 of each light emitting element ED may be removed to partially expose side surfaces of both ends of the semiconductor layers. The exposed side surfaces of the semiconductor layers may directly contact the contact electrodes CNE. Each light emitting element ED may be electrically connected to each electrode RME through a contact electrode CNE.

A second insulating layer PAS2 may be partially disposed on the first insulating layer PAS1 and the light emitting elements ED. For example, the second insulating layer PAS2 may partially surround an outer surface of each light emitting element ED not to cover or overlap the first end and the second end of the light emitting element ED. Of the second insulating layer PAS2, parts disposed on the light emitting elements ED may extend in the second direction DR2 on the first insulating layer PAS1 in a plan view to form linear or island-shaped or isolated-shaped patterns in each subpixel PXn.

For example, the second insulating layer PAS2 may be disposed on the third bank BNL3 and may be disposed on the first insulating layer PAS1 in parts where the electrodes RME may be disposed on the first banks BNL1 or the second bank BNL2. For example, the second insulating layer PAS2 may be disposed on the first insulating layer PAS1 and the third bank BNL3 as well as on the light emitting elements ED in the emission area EMA but may partially expose parts where the electrodes RME may be disposed as well as exposing both ends of each light emitting element ED. This shape of the second insulating layer PAS2 may be obtained by entirely placing the second insulating layer PAS2 on the first insulating layer PAS1 during the manufacturing process of the display device 10 and then removing the second insulating layer PAS2 to expose both ends of each light emitting element ED. The second insulating layer PAS2 may protect the light emitting elements ED while fixing the light emitting elements ED during the manufacturing process of the display device 10. The second insulating layer PAS2 may also fill the space between each light emitting element ED and the first insulating layer PAS1 disposed under or below the light emitting element ED.

Although not illustrated in the drawings, a part of the second insulating layer PAS2 may be disposed in the sub area SA. The electrodes RME disposed in a plurality of subpixels PXn may be formed to extend in the second direction DR2 and to be electrically connected to each other but may be separated in the sub area SA after the alignment of the light emitting elements ED and the formation of the second insulating layer PAS2. In the process of separating the electrodes RME, the first insulating layer PAS1 and the second insulating layer PAS2 as well as the electrodes RME may be partially removed, and a third insulating layer PAS3 to be described later may be directly disposed on the third interlayer insulating layer IL3 in a part from which they may be removed. However, the disclosure is not limited thereto, and the third insulating layer PAS3 may also be removed from the part where the electrodes RME may be separated in the sub area SA to expose a part of the third interlayer insulating layer IL3. Alternatively, another insulating layer disposed on the third insulating layer PAS3 to cover or overlap each member may be directly disposed on the third interlayer insulating layer IL3.

A plurality of contact electrodes CNE and the third insulating layer PAS3 may be disposed on the second insulating layer PAS2. Each of the contact electrodes CNE may contact any one or an end of each of a plurality of light emitting elements ED and at least one electrode RME. For example, each of the contact electrodes CNE may contact an exposed end of each of a plurality of light emitting elements ED on which the first insulating layer PAS1 is not disposed and may contact any one of the electrodes RME through the first contact hole CT1 or the second CT2 formed in the first insulating layer PAS1 to expose a part of the electrode RME. The semiconductor layers may be exposed on both end surfaces of each light emitting element ED in the extending direction of the light emitting element ED, and the contact electrodes CNE may contact each light emitting element ED at the end surfaces where the semiconductor layers may be exposed. Both ends of each light emitting element ED may be electrically connected to the electrodes RME through different contact electrodes CNE.

According to an embodiment, the contact electrodes CNE of the display device 10 may be divided into different types of contact electrodes electrically connected to different types of electrodes. For example, the contact electrodes may include a first contact electrode CNE1 and a second contact electrode CNE2 as first type contact electrodes disposed on the first electrode RME1 and the second electrode RME2 which may be first type electrodes.

The first contact electrode CNE1 and the second contact electrode CNE2 may be disposed on a part of the first electrode RME1 and a part of the second electrode RME2, respectively. Each of the first contact electrode CNE1 and the second contact electrode CNE2 may extend in the second direction DR2 and may form a linear pattern in the emission area EMA of each subpixel PXn. The first contact electrode CNE1 may contact the first electrode RME1 through a first contact hole CT1 exposing an upper surface of the first electrode RME1, and the second contact electrode CNE2 may contact the second electrode RME2 through a first contact hole CT1 exposing an upper surface of the second electrode RME2. For example, the first contact electrode CNE1 may contact the first ends of the first light emitting elements ED1, and the second contact electrode CNE2 may contact the second ends of the second light emitting elements ED2.

The first electrode RME1 and the second electrode RME2 which may be first type electrodes may be directly electrically connected to the fourth conductive layer, and each of the first contact electrode CNE1 and the second contact electrode CNE2 which may be first type contact electrodes may transmit an electrical signal transmitted to a first type electrode to any one or an end of each of a plurality of light emitting elements ED. The electrical signal may be directly transmitted to the first ends of the first light emitting elements ED1 and the second ends of the second light emitting elements ED2 and may be transmitted to other contact electrodes CNE and light emitting elements ED through the second ends of the first light emitting elements ED1 and the first ends of the second light emitting elements ED2.

The contact electrodes CNE may include a third contact electrode CNE3, a fourth contact electrode CNE4, and a fifth contact electrode CNE5 as second type contact electrodes disposed over one or more of the third through eighth electrodes RME3 through RME8 which may be second type electrodes.

The third contact electrode CNE3 may be disposed on the third electrode RME3 and the fifth electrode RME5. The third contact electrode CNE3 may include a first extending part CN_E1 and a second extending part CN_E2 extending in the second direction DR2 and a first connecting part CN_B1 connecting the first extending part CN_E1 and the second extending part CN_E2 in the first area ROP1 of the emission area EMA. The third contact electrode CNE3 may generally extend in the second direction DR2 but may be bent to be disposed on the third electrode RME3 and the fifth electrode RME5. The first extending part CN_E1 may be disposed on the third electrode RME3 to contact the third electrode RME3 and the first light emitting elements ED1. The first extending part CN_E1 may contact the second ends of the first light emitting elements ED1 and the third electrode RME3 exposed through a second contact hole CT2. The second extending part CN_E2 may be disposed on the fifth electrode RME5 to contact the fifth electrode RME5 and the third light emitting elements ED3. The second extending part CN_E2 may contact the first ends of the third light emitting elements ED3 and the fifth electrode RME5 exposed through a second contact hole CT2. The first connecting part CN_B1 may extend in the first direction DR1 in the first area ROP1.

The fourth contact electrode CNE4 may be disposed on the seventh electrode RME7 and the eighth electrode RME8. The fourth contact electrode CNE4 may include a third extending part CN_E3 and a fourth extending part CN_E4 extending in the second direction DR2 and a second connecting part CN_B2 connecting the third extending part CN_E3 and the fourth extending part CN_E4 on the lower side of the emission area EMA. The fourth contact electrode CNE4 may be spaced apart from a fifth extending part CN_E5 of the fifth contact electrode CNE5 to be described later and may surround the fifth extending part CN_E5. The second connecting part CN_B2 may electrically connect the third extending part CN_E3 and the fourth extending part CN_E4 in an area other than the first area ROP1. The third extending part CN_E3 may be disposed on the seventh electrode RME7 to contact the seventh electrode RME7 and the second ends of the third light emitting elements ED3. The fourth extending part CN_E4 may be disposed on the eighth electrode RME8 to contact the eighth electrode RME8 and the first ends of the fourth light emitting elements ED4. The second connecting part CN_B2 may be disposed in a space between the third bank BNL3 and the first banks BNL1 on the lower side of the emission area EMA.

The fifth contact electrode CNE5 may have a similar shape to the third contact electrode CNE3 and may be disposed on the sixth electrode RME6 and the fourth electrode RME4. The sixth contact electrode CNE6 may include the fifth extending part CN_E5 and a sixth extending part CN_E6 extending in the second direction DR2 and a third connecting part CN_B3 connecting the fifth extending part CN_E5 and the sixth extending part CN_E6 in the first area ROP1 of the emission area EMA. The fifth extending part CN_E5 may be disposed on the sixth electrode RME6 to contact the sixth electrode RME6 and the second ends of the fourth light emitting elements ED4, and the sixth extending part CN_E6 may be disposed on the fourth electrode RME4 to contact the fourth electrode RME4 and the first ends of the second light emitting elements ED2. The third connecting part CN_B3 may extend in the first direction DR1 in the first area ROP1.

The first light emitting elements ED1 and the third light emitting elements ED3 may be electrically connected to each other through the third contact electrode CNE3. An electrical signal received through the first contact electrode CNE1 may be transmitted to the third light emitting elements ED3 through the first light emitting elements ED1 and the third contact electrode CNE3. Similarly, the electrical signal may be transmitted to the fourth light emitting elements ED4 and the second light emitting elements ED2 through the fourth contact electrode CNE4 and the fifth contact electrode CNE5. A plurality of light emitting elements ED disposed in one subpixel PXn may be electrically connected in series to each other through second type contact electrodes.

The first and second contact holes CT1 and CT2 formed in parts where the contact electrodes CNE and the electrodes RME contact each other may be disposed not to overlap the light emitting elements ED in the first direction DR1. For example, each of the first and second contact holes CT1 and CT2 may be spaced apart in the second direction DR2 from an area where a plurality of light emitting elements ED may be disposed and may be disposed adjacent to a part of the third bank BNL3 which extends in the first direction DR1. Light is emitted from both ends of each light emitting element ED, and the first and second contact holes CT1 and CT2 may be located or disposed outside of the travelling path of the light. However, the disclosure is not limited thereto, and the positions of the first and second contact holes CT1 and CT2 may vary according to the structures of the electrodes RME and the positions of the light emitting elements ED.

Although one each of the first through fifth contact electrodes CNE1 through CNE5 may be disposed in one subpixel PXn, the disclosure is not limited thereto. The number and shape of each of the first through fifth contact electrodes CNE1 through CNE5 may vary according to the number of electrodes RME disposed in each subpixel PXn.

The contact electrodes CNE may include a conductive material such as ITO, IZO, ITZO, or aluminum (Al). For example, the contact electrodes CNE may include a transparent conductive material, and light emitted from the light emitting elements ED may pass through the contact electrodes CNE and proceed toward the electrodes RME, but the disclosure is not limited thereto.

Some or a number of the contact electrodes CNE may be disposed on the same layer, but the others may be disposed on a different layer. For example, the third contact electrode CNE3 and the fifth contact electrode CNE5 may be disposed on the second insulating layer PAS2, and the first contact electrode CNE1, the second contact electrode CNE2 and the fourth contact electrode CNE4 may be disposed on the third insulating layer PAS3. The third contact electrode CNE3 and the fifth contact electrode CNE5 may be disposed in areas exposed by patterning the second insulating layer PAS2, and the first contact electrode CNE1, the second contact electrode CNE2 and the fourth contact electrode CNE4 may be disposed in areas exposed by patterning the second insulating layer PAS2 and the third insulating layer PAS3. However, the first contact electrode CNE1, the second contact electrode CNE2 and the fourth contact electrode CNE4 may be directly disposed on the first insulating layer PAS1 in areas where the second insulating layer PAS2 and the third insulating layer PAS3 may not be disposed and both ends of the light emitting elements ED may be exposed.

The third insulating layer PAS3 is disposed on the third contact electrode CNE3 and the fifth contact electrode CNE5. Further, the third insulating layer PAS3 may be disposed on the second insulating layer PAS2 excluding the areas where the first contact electrode CNE1, the second contact electrode CNE2, and the fourth contact electrode CNE4 may be disposed. The third insulating layer PAS3 may insulate the first contact electrode CNE1, the second contact electrode CNE2 and the fourth contact electrode CNE4 from the third contact electrode CNE3 and the fifth contact electrode CNE5 to prevent them from directly contacting each other.

The third insulating layer PAS3 may be disposed between the first type contact electrodes and the second type contact electrodes to insulate them from each other. However, the third insulating layer PAS3 may also be omitted as described above. In this case, the contact electrodes CNE may be disposed on the same layer.

Although not illustrated in the drawings, another insulating layer may be further disposed on the contact electrodes CNE, the third insulating layer PAS3, and the third bank BNL3 to cover or overlap them. The insulating layer may be entirely disposed on the first substrate SUB to protect the members disposed on the first substrate SUB from the external environment.

Each of the first insulating layer PAS1, the second insulating layer PAS2 and the third insulating layer PAS3 described above may include an inorganic insulating material or an organic insulating material. In an embodiment, each of the first insulating layer PAS1, the second insulating layer PAS2 and the third insulating layer PAS3 may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$). Alternatively, each of the first insulating layer PAS1, the second insulating layer PAS2 and the third insulating layer PAS3 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polyrnethyl methacrylate, polycarbonate, or polymethyl methacrylate-polycarbonate synthetic resin. However, the disclosure is not limited thereto.

Figure 6:
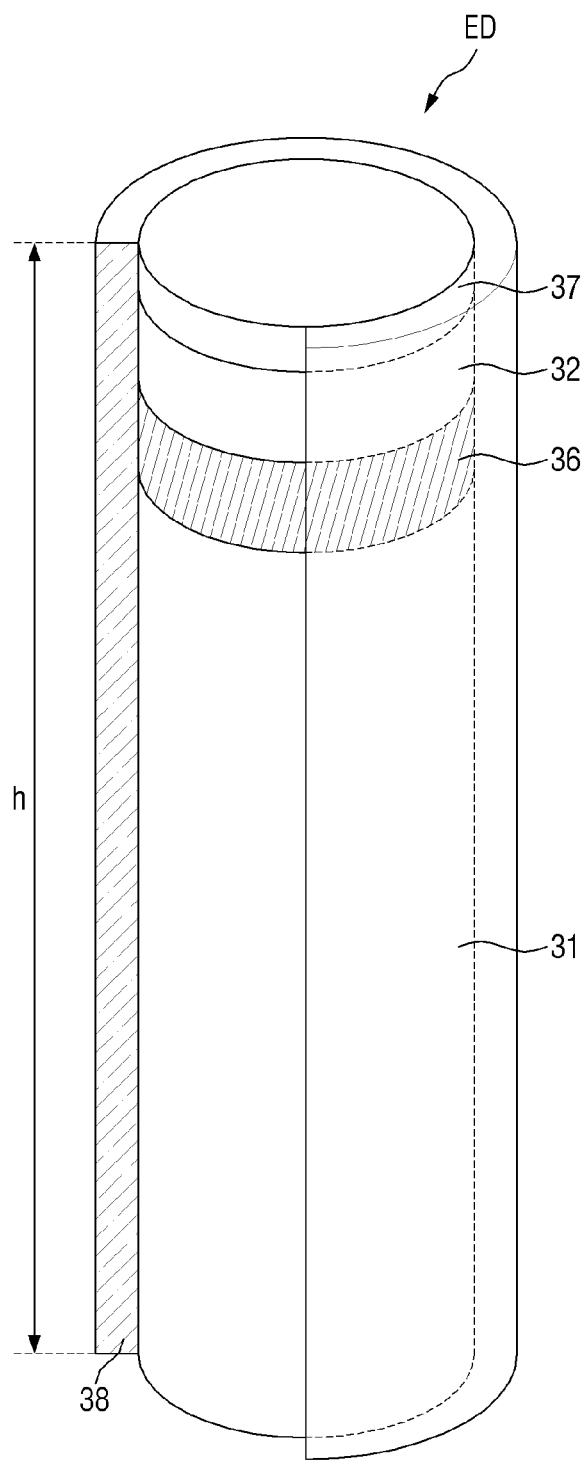
FIG. 6 is a schematic view of a light emitting element according to an embodiment.

FIG. 6 is a schematic view of a light emitting element ED according to an embodiment.

The light emitting element ED may be a light emitting diode. By way of example, the light emitting element ED may be an inorganic light emitting diode having a size of micrometers to nanometers and made of an inorganic material. In a case that an electric field is formed in a specific or predetermined direction between two electrodes facing each other, the inorganic light emitting diode may be aligned between the two electrodes in which polarities may be formed. The light emitting element ED may be aligned between the electrodes by the electric field formed on the two electrodes.

The light emitting element ED according to an embodiment may extend in one or a direction. The light emitting element ED may be shaped substantially like a cylinder, a rod, a wire, a tube, or the like within the spirit and the scope of the disclosure. However, the shape of the light emitting element ED is not limited thereto, and the light emitting element ED may also have various shapes including substantially polygonal prisms, such as substantially a cube, substantially a rectangular parallelepiped and a substantially hexagonal prism, and a shape extending in a direction and having a partially inclined outer surface. A plurality of semiconductors included in the light emitting element ED which will be described later may be sequentially disposed or stacked along the one or a direction.

The light emitting element ED may include a semiconductor layer doped with impurities of any conductivity type (for example, a p type or an n type). The semiconductor layer may receive an electrical signal from an external power source and emit light of a specific or predetermined wavelength band.

Referring to FIG. 6, the light emitting element ED may include a first semiconductor layer 31, a second semiconductor layer 32, the light emitting layer 36, an electrode layer 37, and the insulating film 38.

The first semiconductor layer 31 may be an n-type semiconductor. In a case that the light emitting element ED emits light in a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and InN. The first semiconductor layer 31 may be doped with an n-type dopant, and the n-type dopant may be Si, Ge, Sn, or the like within the spirit and the scope of the disclosure. For example, the first semiconductor layer 31 may be n-GaN doped with n-type Si. The first end of the light emitting element ED may be a part in which the first semiconductor layer 31 is disposed with respect to the light emitting layer 36.

The second semiconductor layer 32 is disposed on the light emitting layer 36 to be described later. The second semiconductor layer 32 may be a p-type semiconductor. In a case that the light emitting element ED emits light in a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, or the like within the spirit and the scope of the disclosure. For example, the second semiconductor layer 32 may be p-GaN doped with p-type Mg. The second end of the light emitting element ED may be a part in which the second semiconductor layer 32 is disposed with respect to the light emitting layer 36.

Although each of the first semiconductor layer 31 and the second semiconductor layer 32 is composed of one layer in the drawing, the disclosure is not limited thereto. Each of the first semiconductor layer 31 and the second semiconductor layer 32 may also include a larger number of layers, for example, may further include a clad layer or a tensile strain barrier reducing (TSBR) layer depending on the material of the light emitting layer 36.

The light emitting layer 36 is disposed between the first semiconductor layer 31 and the second semiconductor layer 32. The light emitting layer 36 may include a material having a single or multiple quantum well structure. In a case that the light emitting layer 36 may include a material having a multiple quantum well structure, it may have a structure in which a plurality of quantum layers and a plurality of well layers may be alternately stacked. The light emitting layer 36 may emit light through combination of electron-hole pairs according to an electrical signal received through the first semiconductor layer 31 and the second semiconductor layer 32. In a case that the light emitting layer 36 emits light in the blue wavelength band, it may include a material such as AlGaN or AlGaInN. For example, in a case that the light emitting layer 36 has a multiple quantum well structure in which a quantum layer and a well layer may be alternately stacked, the quantum layer may include a material such as AlGaN or AlGaInN, and the well layer may include a material such as GaN or AlInN. For example, the light emitting layer 36 may include AlGaInN as a quantum layer and AlInN as a well layer to emit blue light whose central wavelength band is in the range of about 450 to about 495 nm as described above.

However, the disclosure is not limited thereto, and the light emitting layer 36 may also have a structure in which a semiconductor material having a large band gap energy and a semiconductor material having a small band gap energy may be alternately stacked or may include different group 3 to 5 semiconductor materials depending on the wavelength band of light that it emits. Light emitted from the light emitting layer 36 is not limited to light in the blue wavelength band. In some cases, the light emitting layer 36 may emit light in a red or green wavelength band.

Light emitted from the light emitting layer 36 may be radiated not only to an outer surface of the light emitting element ED in a longitudinal direction but also to both side surfaces. The direction of the light emitted from the light emitting layer 36 is not limited to one or a direction.

The electrode layer 37 may be an ohmic contact electrode. However, the disclosure is not limited thereto, and the electrode layer 37 may also be a Schottky contact electrode. The light emitting element ED may include at least one electrode layer 37. Although the light emitting element ED may include one electrode layer 37 in FIG. 6, the disclosure is not limited thereto. In some cases, the light emitting element ED may include more electrode layers 37, or the electrode layer 37 may be omitted. The following description of the light emitting element ED may be applied equally even if the number of electrode layers 37 is changed or other structures may be further included.

In a case that the light emitting element ED is electrically connected to an electrode or a contact electrode in the display device 10 according to an embodiment, the electrode layer 37 may reduce the resistance between the light emitting element ED and the electrode or the contact electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO). For example, the electrode layer 37 may include, but is not limited to, an n-type or p-type doped semiconductor material.

The insulating film 38 surrounds outer surfaces of the semiconductor layers and the electrode layers described above. For example, the insulating film 38 may surround an outer surface of at least the light emitting layer 36 and extend in the direction in which the light emitting element ED extends. The insulating film 38 may protect the above members. The insulating film 38 may surround side surfaces of the above members but may expose both ends of the light emitting element ED in the longitudinal direction.

In the drawing, the insulating film 38 extends in the longitudinal direction of the light emitting element ED to cover or overlap from side surfaces of the first semiconductor layer 31 to side surfaces of the electrode layer 37. However, the disclosure is not limited thereto, and the insulating film 38 may also cover or overlap outer surfaces of only some or a number of semiconductor layers as well as the light emitting layer 36 or may cover or overlap only a part of an outer surface of the electrode layer 37 to partially expose the outer surface of each electrode layer 37. Alternatively, an upper surface of the insulating film 38 may be rounded in cross section in an area adjacent to at least one or an end of the light emitting element ED.

A thickness of the insulating film 38 may be in the range of, but not limited to, about 10 nm to about 1.0 μm. The thickness of the insulating film 38 may be about 40 nm.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In an embodiment, the insulating film 38 may be formed as a double layer or a multilayer in which a plurality of layers may be stacked. In a case that the insulating film 38 is formed as a double layer or a multilayer, layers of the insulating film 38 may include the same or similar material or different materials but may be formed through difference processes. Accordingly, it may be possible to prevent an electrical short circuit that may occur in a case that the light emitting layer 36 directly contacts an electrode that transmits an electrical signal to the light emitting element ED. For example, since the insulating film 38 protects the outer surface of the light emitting element ED including the light emitting layer 36, a reduction in luminous efficiency may be prevented.

For example, an outer surface of the insulating film 38 may be treated. A plurality of light emitting elements ED may be sprayed onto electrodes in a state where they may be dispersed in a predetermined ink and then may be aligned. Here, the surface of the insulating film 38 may be hydrophobic or hydrophilic-treated so that each light emitting element ED remains separate from other adjacent light emitting elements ED in the ink without being agglomerated with them. For example, the outer surface of the insulating film 38 may be treated with a material such as stearic acid or 2,3-naphthalene dicarboxylic acid.

As described above, the display device 10 may include different electrode groups RME#1 and RME#2 spaced apart from each other in the second direction DR2 with the first area ROP1 located or disposed in the emission area EMA interposed between them. A plurality of dummy patterns EP formed by separating the electrode lines RM may be disposed in the first area ROP1 between the electrode groups RME#1 and RME#2 spaced apart from each other. The dummy patterns EP will now be described in detail with further reference to other drawings.

Figure 7:
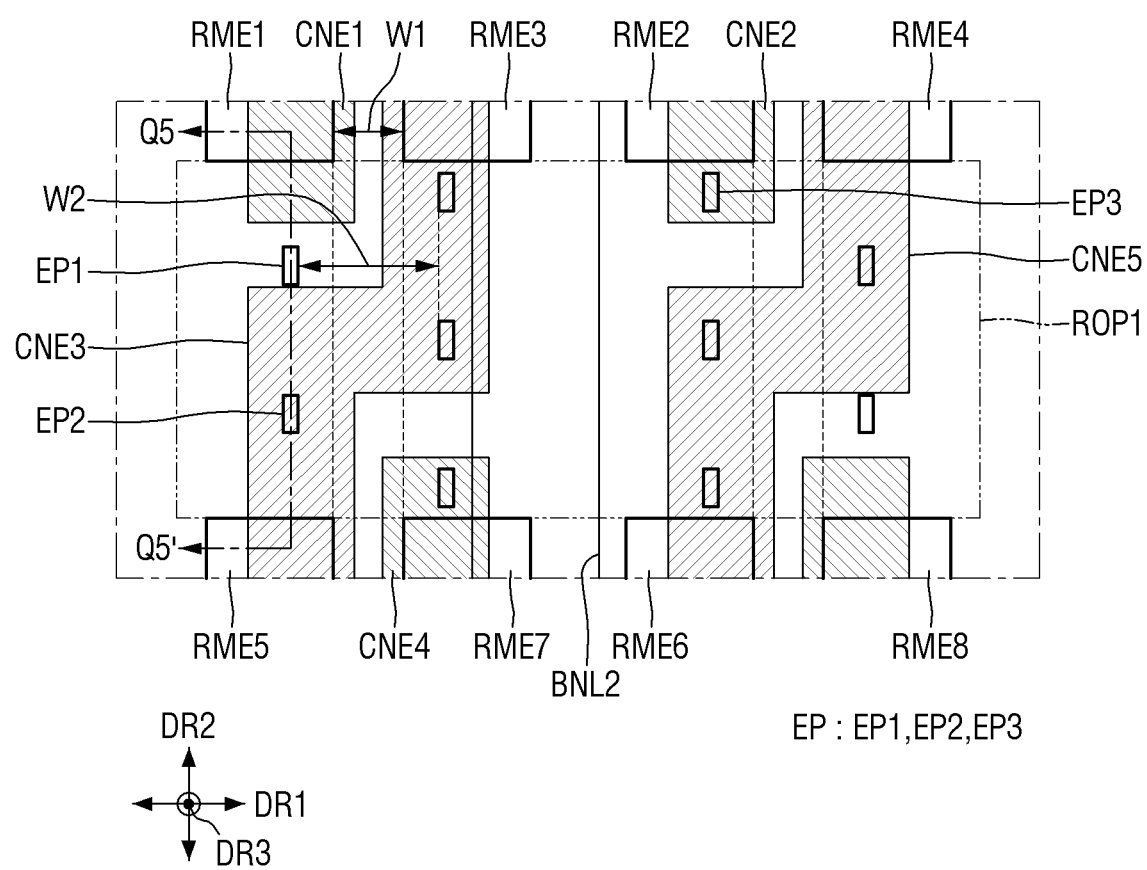
FIG. 7 is an enlarged plan view of a first area in a subpixel of the display device according to an embodiment.
Figure 8:
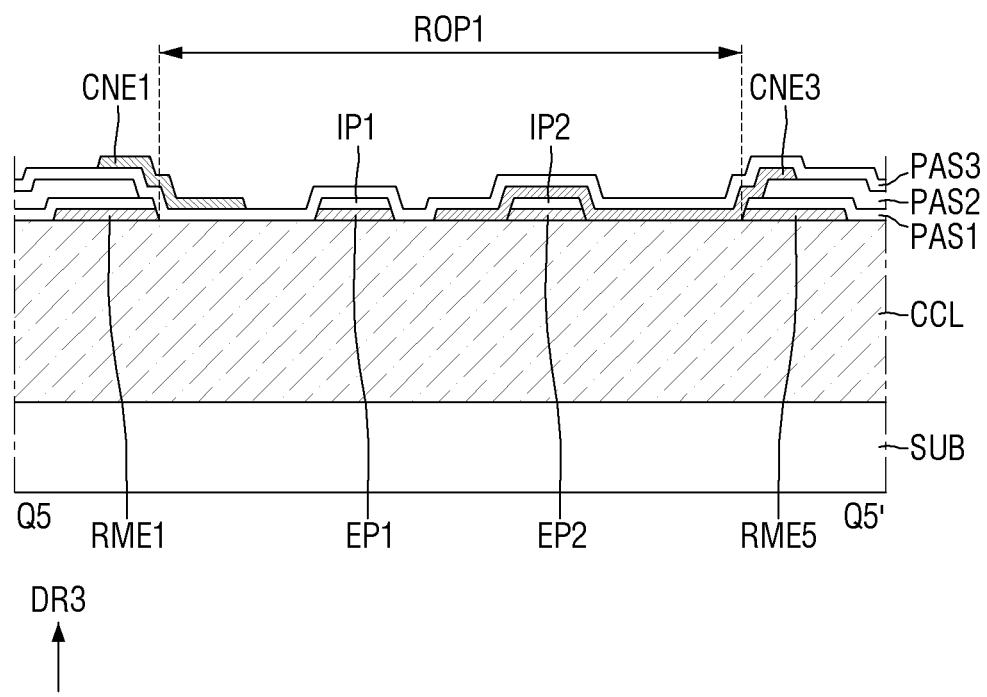
FIG. 8 is a schematic cross-sectional view taken along line Q5-Q5' of FIG. 7.

FIG. 7 is an enlarged plan view of the first area ROP1 in a subpixel PXn of the display device 10 according to an embodiment. FIG. 8 is a schematic cross-sectional view taken along line Q5-Q5' of FIG. 7. FIG. 7 illustrates the schematic arrangement of the dummy patterns EP disposed in the first area ROP1 of the emission area EMA and the electrodes RME and the contact electrodes CNE disposed adjacent to the dummy patterns EP, and FIG. 8 illustrates a cross section across dummy patterns EP (EP1 and EP2) located or disposed between the first electrode RME1 and the fifth electrode RME5.

Referring to FIGS. 7 and 8, the display device 10 according to an embodiment may include a plurality of dummy patterns EP disposed in the first area ROP1 that separates the first electrode group RME#1 and the second electrode group RME#2 in the emission area EMA of each subpixel PXn. The dummy patterns EP may be disposed between the electrodes RME spaced apart in the second direction DR2. The dummy patterns EP may be spaced apart from each other in the first direction DR1 or the second direction DR2, and the gap and arrangement of the dummy patterns EP are not particularly limited. In the drawings, dummy patterns EP spaced apart in the second direction DR2 may be arranged or disposed side by side, but dummy patterns EP spaced apart in the first direction DR1 may be staggered instead of being arranged or disposed side by side. However, the arrangement of the dummy patterns EP is not limited to this arrangement, and the overall arrangement of the dummy patterns EP may be a random arrangement. Alternatively, the dummy patterns EP may be disposed only between some or a number of the electrodes RME spaced apart in the second direction DR2 and may not be disposed between some or a number of other electrodes. For example, in the display device 10, at least one dummy pattern EP may be disposed between the electrodes RME spaced apart in the second direction DR2.

According to an embodiment, at least any one of the dummy patterns EP may be spaced apart from the electrodes RME in the second direction DR2. For example, the dummy patterns EP may include first dummy patterns EP1 spaced apart from the electrodes RME of the first electrode group RME#1 and the electrodes RME of the second electrode group RME#2 in the second direction DR2 and not electrically connected to them. Although one first dummy pattern EP1 may be disposed between the first electrode RME1 and the fifth electrode RME5 and between the fourth electrode RME4 and the eighth electrode RME8 in the drawings, the disclosure is not limited thereto. Since the arrangement of the dummy patterns EP may be changed randomly as described above, the number of first dummy patterns EP1 may be increased or decreased.

The first dummy patterns EP1 may be disposed not to overlap the contact electrodes CNE disposed in the first area ROP1. A first insulating pattern IP1 disposed in the first area ROP1 and the third insulating layer PAS3 covering or overlapping the first insulating pattern IP1 may be disposed on each of the first dummy patterns EP1. The first dummy patterns EP1 may be floating patterns not contacting nor connected to the electrodes RME and the contact electrodes CNE.

In an embodiment, the dummy patterns EP may further include second dummy patterns EP2 and third dummy patterns EP3 spaced apart from the electrodes RME in the second direction DR2, like the first dummy patterns EP1, but overlapping the contact electrodes CNE disposed in the first area ROP1. The second dummy patterns EP2 may overlap the third contact electrode CNE3 and the fifth contact electrode CNE5 which may be second type contact electrodes, and the third dummy patterns EP3 may overlap the first contact electrode CNE1 and the second contact electrode CNE2 which may be first type contact electrodes and the fourth contact electrode CNE4 which may be a second type contact electrode. The second dummy patterns EP2 may be dummy patterns EP contacting contact electrodes disposed under or below the third insulating layer PAS3, and the third dummy patterns EP3 may be dummy patterns EP overlapping contact electrodes disposed on the third insulating layer PAS3.

The second dummy patterns EP2 and the third dummy patterns EP3 may be spaced apart from the electrodes RME of the first electrode group RME#1 and the electrodes RME of the second electrode group RME#2 in the second direction DR2 and may not be electrically connected to them. The first insulating pattern IP1 or a second insulating pattern IP2 disposed in the first area ROP1 and the third insulating layer PAS3 covering or overlapping the first or second insulating pattern IP1 or IP2 may also be disposed on each of the second and third dummy patterns EP2 and EP3. For example, the second insulating pattern IP2 may be directly disposed on each of the second dummy patterns EP2, and the third contact electrode CNE3 and the third insulating layer PAS3 may be sequentially disposed on the second insulating pattern IP2. Although not illustrated in the drawings, the first insulating pattern IP1 may be directly disposed on each of the third dummy patterns EP3, and the third insulating layer PAS3 and the second contact electrode CNE2 may be sequentially disposed on the first insulating pattern IP1.

Each of the third dummy patterns EP3, like the first dummy patterns EP1, may have a first or second insulating pattern IP1 or IP2 and the third insulating layer PAS3 covering or overlapping the first or second insulating pattern IP1 or IP2 disposed on the third dummy pattern EP3. The third dummy patterns EP3 may be floating patterns not contacting nor connected to the electrodes RME and the contact electrodes CNE.

On the other hand, each of the second dummy patterns EP2 may partially contact the third contact electrode CNE3 which may be a contact electrode disposed under or below the third insulating layer PAS3. As will be described later, the dummy patterns EP may be parts remaining together with the first or second insulating patterns IP1 and IP2 disposed thereon in the process of forming the electrode lines RM, and side surfaces of each dummy pattern EP may be exposed without having an insulating layer disposed thereon. The third contact electrode CNE3 and the fifth contact electrode CNE5 formed after the process of separating the electrode lines RM may directly contact the second dummy patterns EP2 having the exposed side surfaces in the first area ROP1. Different from the first dummy patterns EP1, the second dummy patterns EP2 may contact the contact electrodes CNE to which an electrical signal is transmitted and may not be floating patterns, different from the first dummy patterns EP1.

According to an embodiment, a vertical gap W2 measured in the first direction DR1 between dummy patterns EP disposed parallel to different electrodes RME in the second direction DR2 among a plurality of dummy patterns EP may be greater than a gap W1 between electrodes RME spaced apart in the first direction DR1. A smallest gap W1 in the first direction DR1 may be a gap between electrodes on which the same light emitting elements ED may be disposed among different electrodes RME. For example, a first gap W1 which is a gap between the first electrode RME1 and the third electrode RME3 may be considered as a gap between electrodes RME spaced apart in the first direction DR1. For example, a gap in the first direction DR1 between the second electrode RME2 and the fourth electrode RME4, between the fifth electrode RME5 and the seventh electrode RME7, and between the sixth electrode RME6 and the eighth electrode RME8 may be defined as the first gap W1.

A shortest gap W2 between dummy patterns EP may be a second gap W2 between dummy patterns EP parallel to different electrodes RME in the second direction DR2 among the dummy patterns EP. For example, a vertical gap between a dummy pattern EP parallel to the first electrode RME1 or the fifth electrode RME5 in the second direction DR2 and a dummy pattern EP parallel to the third electrode RME3 or the seventh electrode RME7 in the second direction DR2 may be considered as the second gap W2. For example, a vertical gap between a dummy pattern EP parallel to the second electrode RME2 or the sixth electrode RME6 in the second direction DR2 and a dummy pattern EP parallel to the fourth electrode RME4 or the eighth electrode RME8 in the second direction DR2 may be considered as the second gap W2.

The dummy patterns EP may be arranged or disposed randomly in the first area ROP1 but may be disposed such that at least the second gap W2 is greater than the first gap W1 between the electrodes RME. The dummy patterns EP may be spaced apart in the first direction DR1 from imaginary lines (dotted lines of FIG. 7) extending from facing sides of the electrodes RME spaced apart in the first direction DR1 and may be spaced apart from some or a number of the electrodes RME in the second direction DR2. For example, the first gap W1 between the electrodes RME spaced apart in the first direction DR1 may be smaller than a length h (see FIG. 6) of each light emitting element ED, and the second gap W2 which is the vertical gap between the dummy patterns EP may be greater than the length h of each light emitting element ED.

The dummy patterns EP described above may be formed in the process of forming the electrode lines RM and then separating the electrode lines RM into the electrodes RME spaced apart in the second direction DR2 during the manufacturing process of the display device 10. In the process of partially patterning and separating the electrode lines RM after the light emitting elements ED may be formed or disposed on the electrode lines RM, parts of the electrode lines RM on which the light emitting elements ED may be disposed may be covered or overlapped by the light emitting elements ED and thus may not be completely removed. The parts covered or overlapped by the light emitting elements ED and thus remaining without being removed in the process of patterning the electrode lines RM may form the dummy patterns EP. The process of separating the electrode lines RM in the emission area EMA is a process of separating the electrodes RME into the first electrode group RME#1 and the second electrode group RME#2, and electrodes parallel to each other in the second direction DR2 need to be completely separated.

As will be described later, each of the electrode lines RM may include parts RM_E and RM_P (see FIG. 9) having different widths and thus may be spaced apart from another electrode line RM in the first direction DR1 by a different distance depending on position. In a part of each electrode line RM which is spaced apart from another electrode line RM by a larger distance than other parts, even if there is a part covered or overlapped by a light emitting element ED, an electrode line RM spaced apart from this part in the first direction DR1 may not be covered or overlapped by the light emitting element ED. Each of the dummy patterns EP formed in the process of separating the electrode lines RM may not be disposed side by side in the first direction DR1 with at least another dummy pattern EP spaced apart from the dummy pattern EP by a shortest vertical distance in the first direction DR1. Accordingly, it may be possible to prevent a large number of dummy patterns EP from being connected to each other by the light emitting elements ED arranged or disposed randomly in the first area ROP1 of the emission area EMA, and at least the electrodes RME of the first electrode group RME#1 and the second electrode group RME#2 may be completely separated, thereby preventing a short circuit between them. This will be described in more detail with further reference to other drawings.

Figure 9:
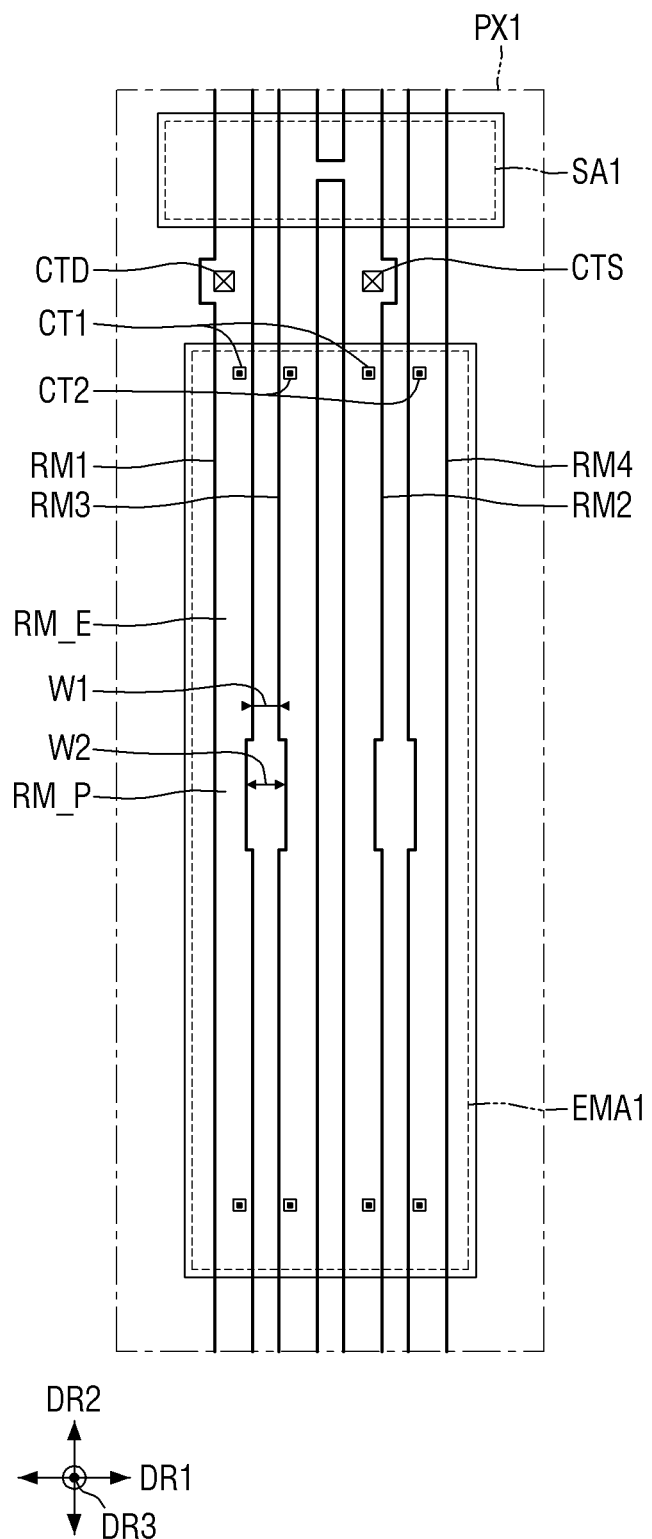
FIGS. 9 and 10 are plan views schematically illustrating operations in a process of manufacturing the display device according to an embodiment.
Figure 10:
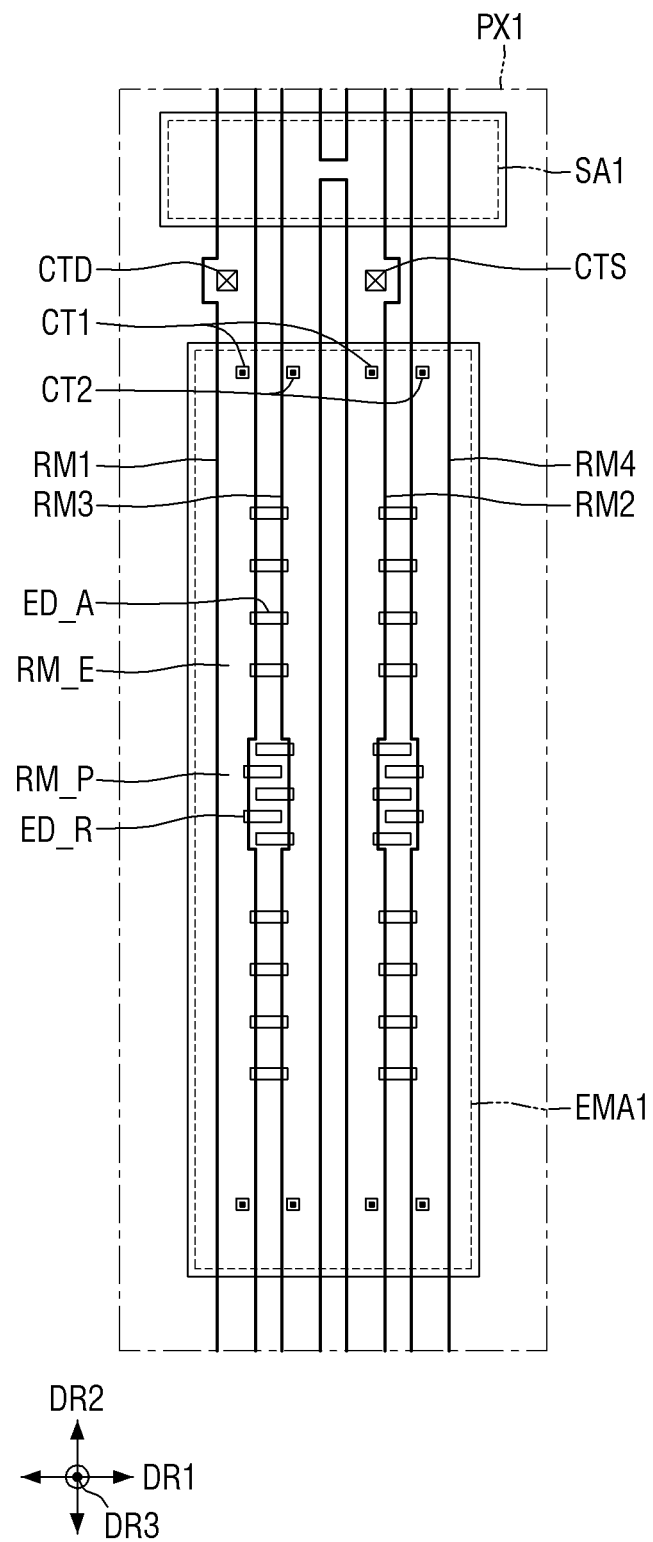

FIGS. 9 and 10 are plan views schematically illustrating operations in a process of manufacturing the display device 10 according to an embodiment. In FIGS. 9 and 10, an operation of aligning the light emitting elements ED during the manufacturing process of the display device 10 is illustrated using the first subpixel PX1 as an example. For ease of description, only the third bank BNL3, the electrode lines RM, and the light emitting elements ED in the emission area EMA and the sub area SA of one subpixel PXn are illustrated in the following drawings.

First, referring to FIG. 9, the manufacturing process of the display device 10 may include an operation of forming a plurality of electrode lines RM disposed in a plurality of subpixels PXn and extending in the second direction DR2. The electrode lines RM may extend in the second direction DR2 and may be disposed over the emission areas EMA and the sub areas SA of the subpixels PXn. The electrode lines RM may include a first electrode line RM1, a third electrode line RM3, a second electrode line RM2 and a fourth electrode line RM4 which may be sequentially disposed in the first direction DR1 in the emission area EMA. Parts of the first electrode line RM1 and the second electrode line RM2 which may overlap the third bank BNL3 may be directly electrically connected to the fourth conductive layer thereunder or below through the electrode contact holes CTD and CTS. For example, the second electrode line RM2 and the third electrode line RM3 may be electrically connected to each other in the sub area SA. Each electrode line RM may be utilized to generate an electric field for aligning the light emitting elements ED.

According to an embodiment, each electrode line RM may include a first part RM_E and a second part RM_P having a smaller width than the first part RM_E. The first part RM_E may be a part disposed in an area other than the first area ROP1 in the emission area EMA, and the second part RM_P may be a part disposed in the first area ROP1. Respective sides of the first part RM_E and the second part RM_P may be connected to each other in parallel in the second direction DR2, and the other sides opposite the above sides may be connected such that the second part RM_P may be recessed inward. For example, sides of the first electrode line RM1 and the third electrode line RM3 which may be opposite facing sides of the first electrode line RM1 and the third electrode line RM3 may extend in the second direction DR2, but the facing sides of the first electrode line RM1 and the third electrode line RM3 may be formed such that a gap W1 between the first parts RM_E is smaller than a gap W2 between the second parts RM_P. As will be described later, the shape of each electrode line RM may be designed such that the electrode line RM may be completely separated in the second part RM_P in the process of placing the light emitting elements ED and separating the electrode line RM.

Although not illustrated in the drawing, the first insulating layer PAS1 is disposed on the electrode lines RM. The first insulating layer PAS1 may include a plurality of first and second contact holes CT1 and CT2 partially exposing the electrode lines RM.

Next, referring to FIG. 10, a plurality of light emitting elements ED may be placed or disposed on the electrode lines RM in the emission area EMA of the subpixel PXn. In an embodiment, the light emitting elements ED dispersed in ink may be prepared and sprayed to the emission area EMA of each subpixel PXn through an inkjet printing process. The third bank BNL3 may prevent the ink from overflowing to the emission area EMA of another neighboring or adjacent subpixel PXn. In a case that the ink is sprayed to the emission area EMA, an alignment signal is transmitted to each electrode line RM to generate an electric field in the emission area EMA. As the positions and orientation directions of the light emitting elements ED dispersed in the ink may be changed by a dielectrophoretic force due to the electric field, both ends of each light emitting element ED may be placed on different electrode lines RM. Although not illustrated in the drawings, once the light emitting elements ED may be placed or disposed, the second insulating layer PAS2 for fixing the light emitting elements ED may be formed.

In an embodiment, the first electrode line RM1 may receive an alignment signal different from alignment signals transmitted to the second electrode line RM2, the third electrode line RM3 and the fourth electrode line RM4. The electric field generated by the alignment signal may be generated between the first electrode line RM1 and the third electrode line RM3 and between the second electrode line RM2 and the fourth electrode line RM4. The light emitting elements ED may be disposed only between the first and second banks BNL1 and BNL2 along the electric field and may not be disposed on the second bank BNL2.

The light emitting elements ED disposed on the electrode lines RM may be divided into light emitting elements ED_A having both ends disposed on the first parts RM_E of the electrode lines RM and light emitting elements ED_R disposed on the second parts RM_P. The gap W1 between the first parts RM_E of the electrode lines RM may be smaller than the length h of each light emitting element ED, but the gap W2 between the second parts RM_P may be greater than the length h of each light emitting element ED. Accordingly, each of the light emitting elements ED_A disposed on the first parts RM_E may generally have both ends disposed on different electrode lines RM, respectively, and each of the light emitting elements ED_R disposed on the second parts RM_P may generally have any one of both ends disposed on an electrode line RM. Each of the light emitting elements ED_R disposed on the second parts RM_P may overlap any one electrode line RM. Accordingly, only one or an end of each light emitting element ED_R may be disposed on an electrode line RM. The second part RM_P of each electrode line RM may have a part covered or overlapped by the light emitting elements ED_R disposed thereon and a part not covered or overlapped by the light emitting elements ED_R.

In the drawing, the density of the light emitting elements ED_A disposed on the first parts RM_E is different from the density of the light emitting elements ED_R disposed on the second parts RM_P. However, this does not mean that the light emitting elements ED may be concentrated on the second parts RM_P. The light emitting elements ED may be disposed at a relatively uniform density on the electrode lines RM, and the drawing only illustrates the light emitting elements ED according to their positions. For example, unlike in the drawing, the number of light emitting elements ED_A disposed on each first part RM_E may be equal to or greater than the number of light emitting elements ED_R disposed on each second part RM_P.

Next, the second parts RM_P of the electrode lines RM may be patterned and separated to form a plurality of electrodes RME spaced apart in the second direction DR2.

Figure 11:
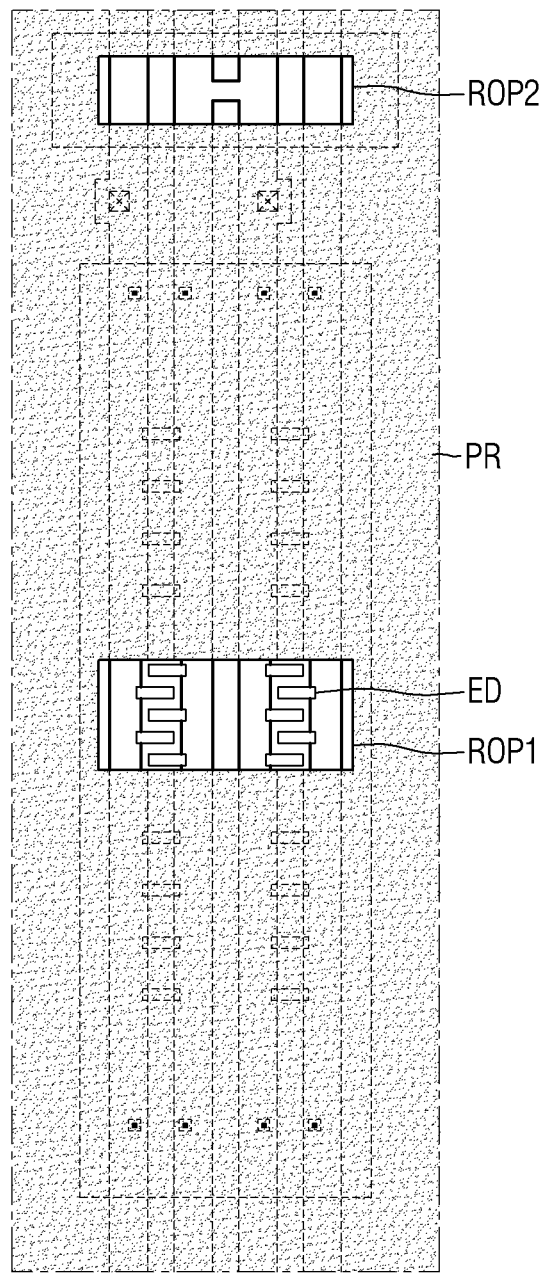
FIG. 11 is a plan view schematically illustrating an operation in the process of manufacturing the display device according to an embodiment.
Figure 12:
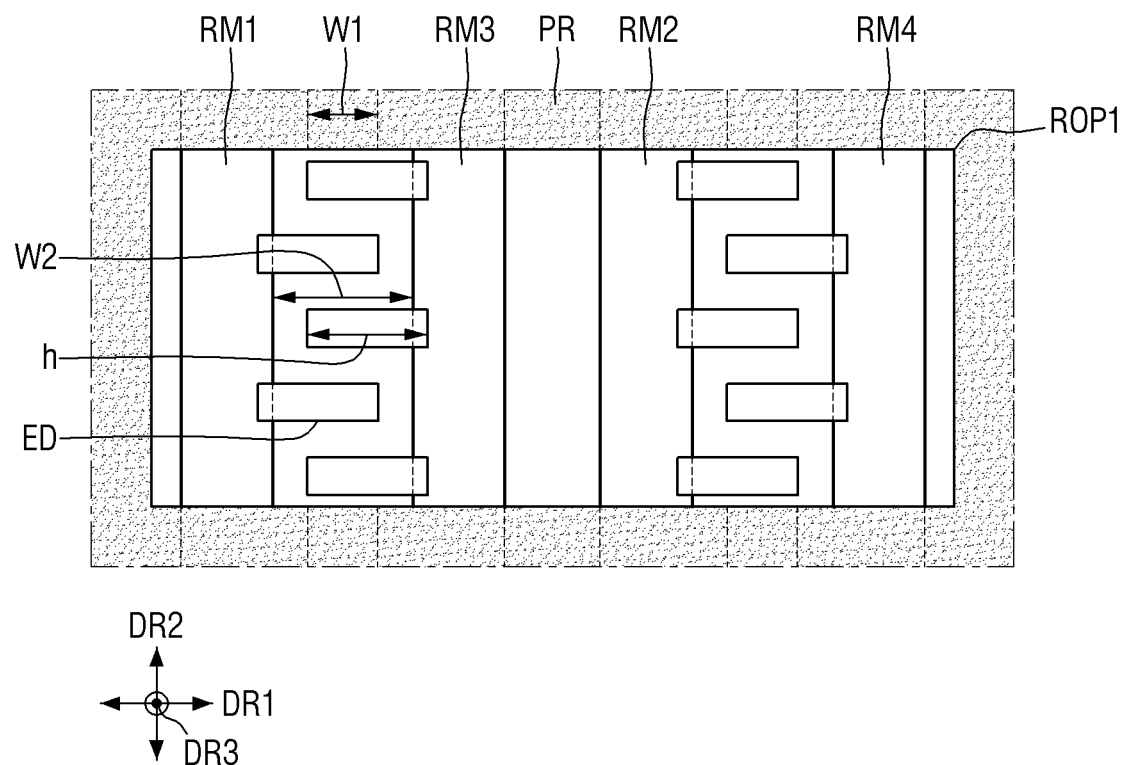
FIG. 12 is an enlarged plan view of the first area of a subpixel in the operation of FIG. 11.

FIG. 11 is a plan view schematically illustrating an operation in the process of manufacturing the display device 10 according to an embodiment. FIG. 12 is an enlarged plan view of the first area ROP1 of a subpixel PXn in the operation of FIG. 11.

Referring to FIGS. 11 and 12, the process of separating the electrode lines RM may include an operation of forming a photoresist layer PR covering or overlapping the electrode lines RM and the third bank BNL3. The photoresist layer PR may be entirely disposed in the subpixel PXn except for areas where the electrode lines RM may be separated. For example, the photoresist layer PR may be disposed in the entire area except for the first area ROP1 of the emission area EMA and the second area ROP2 of the sub area SA. Only the second parts RM_P of the electrode lines RM may be disposed in the first area ROP1 of the emission area EMA, and most of the first parts RM_E may be covered or overlapped by the photoresist layer PR. In the case of the light emitting elements ED, only the light emitting elements ED_R disposed on the second parts RM_P may be exposed.

Before the photoresist layer PR is formed and after the light emitting elements ED may be placed or disposed, the second insulating layer PAS2 covering or overlapping them may be formed. The second insulating layer PAS2 may be formed to cover or overlap the light emitting elements ED_A disposed on the first parts RM_E of the electrode lines RM but not to cover or overlap the light emitting elements ED_R disposed in the first area ROP1. Accordingly, in FIG. 12, the second parts RM_P of the electrode lines RM, the first insulating layer PAS1, the light emitting elements ED_R, and the photoresist layer PR may be sequentially stacked in the first area ROP1.

As described above, the gap W2 between the second parts RM_P of the electrode lines RM may be greater than the gap W1 between the first parts RM_E and may also be greater than the length h of each light emitting element ED. Each of the light emitting elements ED_R disposed on the second parts RM_P may have only one or an end disposed on any one electrode line RM and the other or another end disposed in an area between the electrode lines RM. Thus, parts of an electrode line RM facing, in the first direction DR1, parts of another electrode line RM which may be covered or overlapped by the light emitting elements ED disposed thereon may be exposed without being covered or overlapped by the light emitting elements ED. An etching process for removing the first insulating layer PAS1 and the electrode lines RM may be performed on parts exposed by the photoresist layer PR. In this process, the electrode lines RM and the first insulating layer PAS1 in the parts covered or overlapped by the light emitting elements ED may not be removed but may remain as the dummy patterns EP and the first and second insulating patterns IP1 and IP2.

Figure 13:
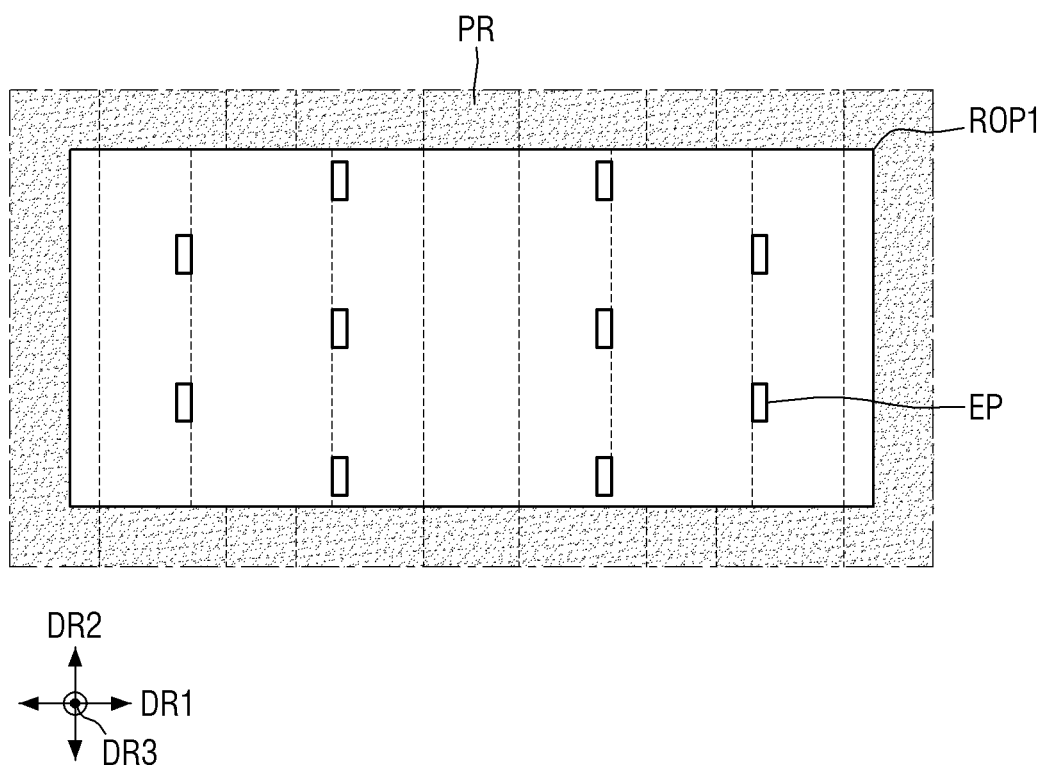
FIG. 13 is an enlarged plan view of the first area of a subpixel in an operation in the process of manufacturing the display device according to an embodiment.
Figure 14:
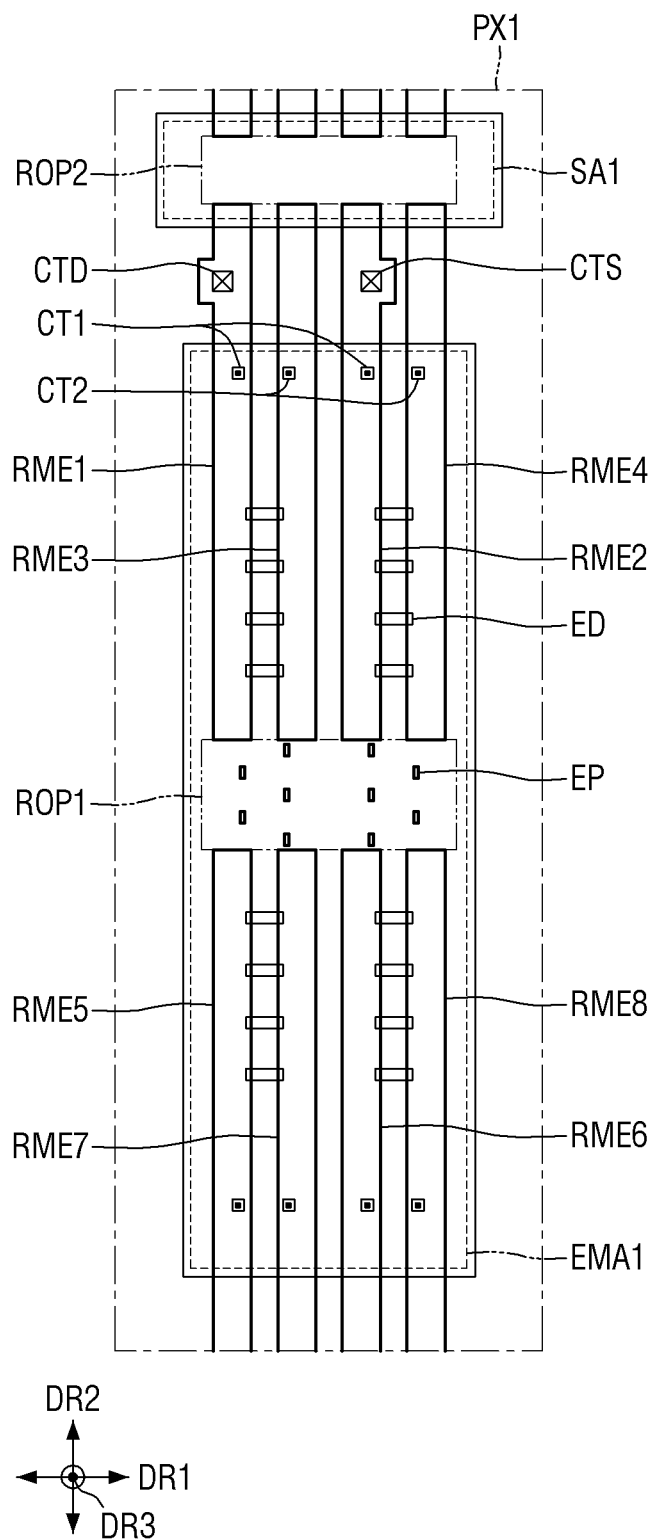
FIG. 14 is a plan view of a subpixel in the operation of FIG. 13.

FIG. 13 is an enlarged plan view of the first area ROP1 of a subpixel PXn in an operation in the process of manufacturing the display device 10 according to an embodiment. FIG. 14 is a plan view of a subpixel PXn in the operation of FIG. 13.

Next, referring to FIGS. 13 and 14, the process of removing the first insulating layer PAS1 and the electrode lines RM from the parts exposed by the photoresist layer PR is performed. In an embodiment, the process of etching the parts of the first insulating layer PAS1 and the electrode lines RM which may be exposed by the photoresist layer PR may include a first etching process for etching the first insulating layer PAS1 and a second etching process for etching the electrode lines RM. The first etching process may be a dry etching process, and the second etching process may be a wet etching process.

In the first etching process and the second etching process, the light emitting elements ED disposed on the electrode lines RM may serve as a mask used to etch the first insulating layer PAS1 and the electrode lines RM disposed under or below the light emitting elements ED. Accordingly, in a case that the first etching process is performed on the parts exposed by the photoresist layer PR, the first insulating layer PAS1 excluding the parts covered or overlapped by the light emitting elements ED may be etched. For example, the first insulating layer PAS1 in the parts covered or overlapped by the light emitting elements ED may not be removed by the first etching process. Next, in a case that the second etching process for removing the electrode lines RM is performed, the first insulating layer PAS1 remaining without being removed may serve as a mask, and the electrode lines RM disposed under or below the first insulating layer PAS1 may remain as the dummy patterns EP.

In a case that the process of separating the electrode lines RM in the first area ROP1 is performed through the above process, un-etched areas may remain according to the arrangement of the light emitting elements ED, and a plurality of dummy patterns EP may be formed between the separated electrode lines RM. The first and second insulating patterns IP1 and IP2 remaining after the etching of the first insulating layer PAS1 may be disposed on the dummy patterns EP. According to an embodiment, each of the dummy patterns EP formed by the removal of the second parts RM_P of the electrode lines RM may not be disposed side by side in the first direction DR1 with at least another dummy pattern EP spaced apart from the dummy pattern EP by the shortest vertical distance in the first direction DR1 according to the arrangement of the light emitting elements ED. Accordingly, most of the second parts RM_P of the electrode lines RM may be removed, and thus the electrode lines RM may be completely separated into the electrodes RME spaced apart in the second direction DR2. For example, the electrodes RME of the first electrode group RME#1 and the second electrode group RME#2 may be prevented from being connected to each other by the dummy patterns EP.

In the current process, the electrode lines RM in the sub area SA may also be partially separated. However, since the light emitting elements ED may not be disposed in the sub area SA, the electrode lines RM may not have parts covered or overlapped by the light emitting elements ED. For example, in the sub area SA, the dummy patterns EP may not be formed, and the electrode lines RM may be completely separated.

Next, although not illustrated in the drawings, the contact electrodes CNE and the third insulating layer PAS3 may be formed to manufacture the display device 10 according to an embodiment.

Display devices 10 according to embodiments will now be described with reference to other drawings.

Figure 15:
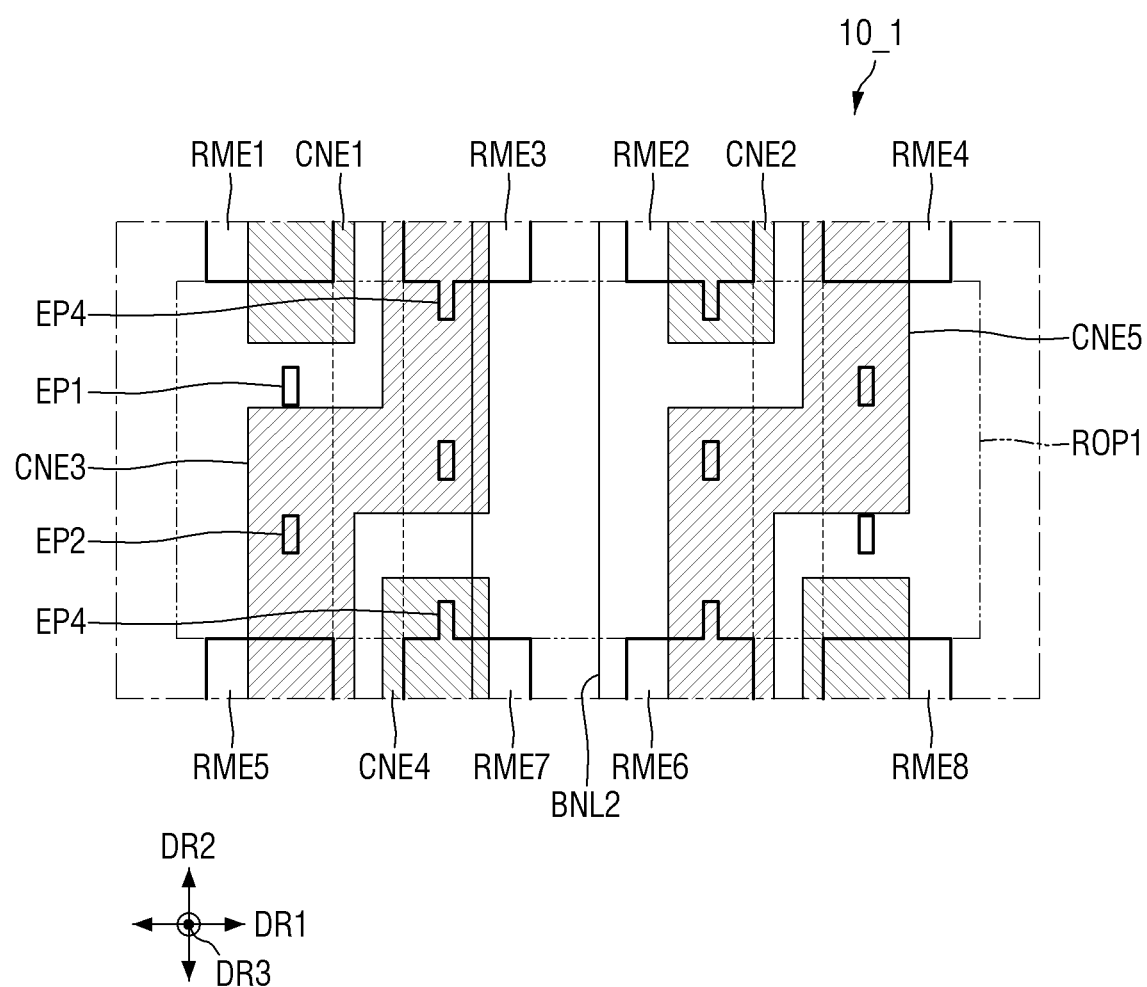
FIGS. 15 through 17 are enlarged plan views of first areas in subpixels of display devices according to embodiments.
Figure 16:
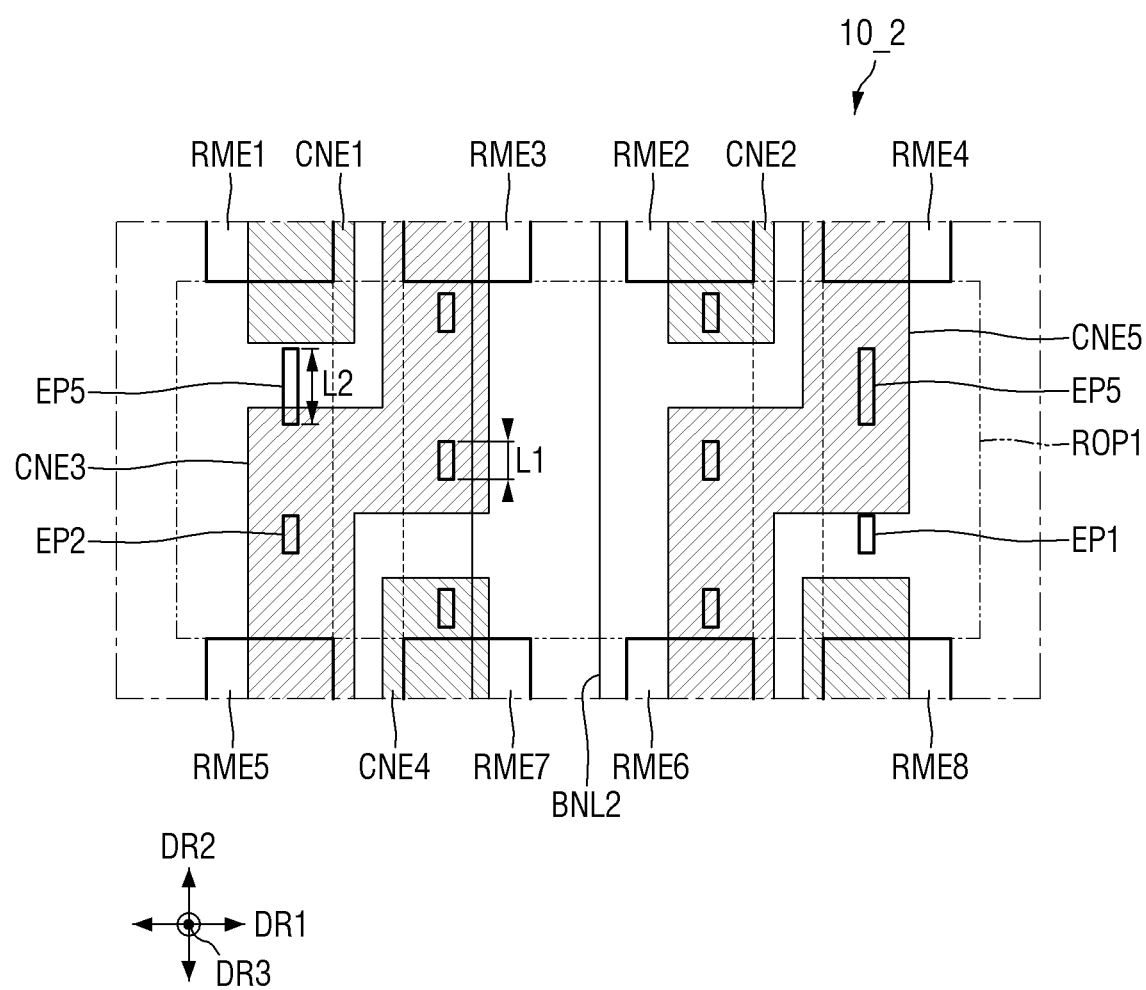
Figure 17:
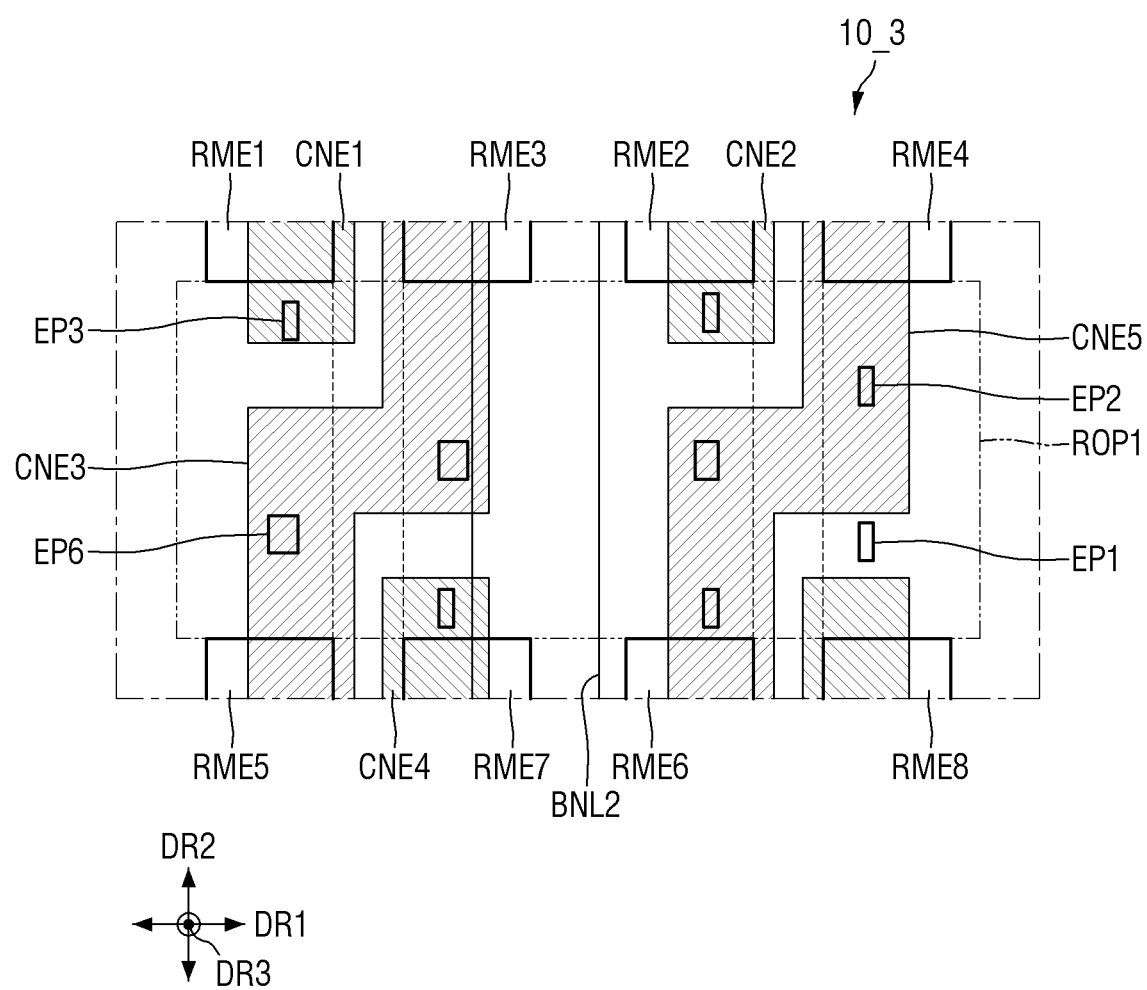

FIGS. 15 through 17 are enlarged plan views of first areas ROP1 in subpixels of display devices according to embodiments. FIGS. 15 through 17 illustrate the schematic arrangements of dummy patterns EP in the first areas ROP1 of emission areas EMA of display devices 10 according to various embodiments.

Referring to FIG. 15, a display device 10_1 according to an embodiment may further include a plurality of fourth dummy patterns EP4, each connected to any one of electrodes RME. The fourth dummy patterns EP4 may be parts remaining due to light emitting elements ED in parts, which may be connected to first parts RM_E, of second parts RM_P of the electrode lines RM. Different from other dummy patterns, for example, first through third dummy patterns EP1 through EP3, each of the fourth dummy patterns EP4 may be connected and integrated with any one of the electrodes RME spaced apart in the second direction DR2.

As described above, the dummy patterns EP disposed between a first electrode group RME#1 and a second electrode group RME#2 may not necessarily be arranged or disposed in the second direction DR2 or spaced apart from the electrodes RME. The arrangement of the dummy patterns EP may be variously changed as long as the electrodes RME spaced apart in the second direction DR2 may not be connected to each other. In an embodiment, the dummy patterns EP may further include the fourth dummy patterns EP4 connected and integrated with the electrodes RME.

Referring to FIG. 16, a display device 10_2 according to an embodiment may further include fifth dummy patterns EP5 whose lengths measured in a direction may be different from those of other dummy patterns EP. Dummy patterns EP may be parts of second parts RM_P of electrode lines RM which remain due to light emitting elements ED, and a length of each dummy pattern EP measured in the second direction DR2 may be equal to a diameter of each light emitting element ED. However, a dummy pattern EP remaining due to one or more light emitting elements ED disposed on a second part RM_P in a clustered state may have a length greater than the diameter of each light emitting element ED.

According to an embodiment, the dummy patterns EP may include dummy patterns EP having a first length L1 measured in the second direction DR2 and the fifth dummy patterns EP5 having a second length L2 greater than the first length L1. First dummy patterns EP1 and second dummy patterns EP2 may have the first length L1, and the first length L1 may be equal to the diameter of each light emitting element ED. On the other hand, the fifth dummy patterns EP5 may have the second length L2 greater than the first length L1 and greater than the diameter of each light emitting element ED.

Referring to FIG. 17, a display device 10_3 according to an embodiment may further include sixth dummy patterns EP6 whose widths measured in the first direction DR1 may be different from those of other dummy patterns EP. In second parts RM_P of electrode lines RM, each dummy pattern EP may overlap any one electrode line RM. A part of each light emitting element ED which overlaps an electrode line RM may have a different width according to the degree to which the light emitting element ED overlaps the electrode line RM. Accordingly, the dummy patterns EP remaining due to light emitting elements ED_R disposed on the second parts RM_P may have different widths.

According to an embodiment, the dummy patterns EP may include the sixth dummy patterns EP6 whose widths measured in the first direction DR1 may be greater than those of other dummy patterns EP. In a case that first dummy patterns EP1 and second dummy patterns EP2 have a first width, the sixth dummy patterns EP6 may have a second width greater than the first width.

The shapes and arrangement of the dummy patterns EP may vary according to the arrangement of the light emitting elements ED in the manufacturing process of the display device 10. For example, since the gap between the second parts RM_P of the electrode lines RM may be greater than a length h of each light emitting element ED, the dummy patterns EP may be randomly arranged or disposed without any particular regularity. However, each of the dummy patterns EP may be disposed not to neighbor, in the first direction DR1, another dummy pattern EP spaced apart from the dummy pattern EP by the shortest vertical distance in the first direction DR1, so that at least electrodes RME of a first electrode group RME#1 and a second electrode group RME#2 may be spaced apart in the second direction DR2. In the manufacturing process of the display device 10 according to an embodiment, since electrodes of different groups may be completely separated in the emission area EMA by designing specific or predetermined shapes of the electrode lines RM, a short circuit between different electrodes RME may be prevented.

In a display device according to an embodiment, since electrode lines have a specific or predetermined shape during a manufacturing process, electrodes separated from each other in an emission area may be prevented from being connected by dummy patterns. The display device may include a plurality of dummy patterns disposed between the electrodes, but different electrodes may not be connected by these dummy patterns, and a short circuit between the electrodes may be prevented.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. A display device comprising:
   an emission area and a sub area disposed on a side of the emission area and spaced apart from the emission area;
   a plurality of electrodes disposed in the emission area and spaced apart from each other in a first direction and a second direction intersecting the first direction, the plurality of electrodes extending in the second direction; and
   a plurality of light emitting elements having ends disposed on the plurality of electrodes spaced apart in the first direction,
   wherein the emission area comprises:
      a first area where some of electrodes are spaced apart from each other in the second direction; and
      a plurality of first dummy patterns disposed in the first area and spaced apart from the plurality of electrodes in the second direction.

2. The display device of claim 1, wherein a vertical distance in the first direction between the plurality of first dummy patterns is greater than a gap between the plurality of electrodes spaced apart in the first direction.

3. The display device of claim 2, wherein the vertical distance in the first direction between the plurality of first dummy patterns is greater than a length of each of the plurality of light emitting elements.

4. The display device of claim 2, wherein each of the plurality of first dummy patterns is spaced apart in the first direction from an imaginary line extending from sides of the plurality of electrodes disposed side by side in the second direction.

5. The display device of claim 4, wherein the plurality of first dummy patterns are not disposed side by side with each other in the first direction.

6. The display device of claim 2, wherein
   a number of the plurality of electrodes are disposed in the sub area and spaced apart from other electrodes of the plurality of electrodes in the second direction, and
   the plurality of first dummy patterns are not disposed in a second area where some of the plurality of electrodes are spaced apart from each other in the sub area.

7. The display device of claim 2, further comprising:
   a first insulating layer disposed on the plurality of electrodes; and
   insulating patterns disposed on the plurality of first dummy patterns.

8. The display device of claim 1, wherein the plurality of electrodes comprise:
   a first electrode;
   a second electrode spaced apart from the first electrode in the first direction;
   a third electrode disposed between the first electrode and the second electrode;
   a fourth electrode spaced apart from the second electrode in the first direction;
   a fifth electrode spaced apart from the first electrode in the second direction;
   a sixth electrode spaced apart from the second electrode in the second direction;
   a seventh electrode spaced apart from the third electrode in the second direction; and
   an eighth electrode spaced apart from the fourth electrode in the second direction.

9. The display device of claim 8, further comprising:
   a first contact electrode disposed on the first electrode and electrically contacting a number of the plurality of light emitting elements;
   a second contact electrode disposed on the second electrode and electrically contacting a number of the plurality of light emitting elements; and
   a third contact electrode disposed on the third electrode and the fifth electrode and comprising a first connecting part extending in the first direction in the first area,
   wherein the plurality of first dummy patterns do not overlap the first contact electrode, the second contact electrode, and the third contact electrode.

10. The display device of claim 9, further comprising a second dummy pattern overlapping the third contact electrode and directly contacting the third contact electrode.

11. The display device of claim 9, further comprising:
   a fourth contact electrode disposed on the seventh electrode and the eighth electrode of the plurality of electrodes and comprising a second connecting part extending in the first direction in an area other than the first area;
   a fifth contact electrode disposed on the fourth electrode and the sixth electrode of the plurality of electrodes and comprising a third connecting part extending in the first direction in the first area; and
   a third dummy pattern overlapping one of the first contact electrode, the second contact electrode and the fourth contact electrode, the third dummy pattern not directly contacting a corresponding contact electrode.

12. The display device of claim 9, further comprising at least one fourth dummy pattern directly connected to one of the first electrode, the second electrode, the third electrode, the fourth electrode, the fifth electrode, the sixth electrode, the seventh electrode, and the eight electrode of the plurality of electrodes.

13. The display device of claim 9, further comprising at least one fifth dummy pattern having a length in the second direction greater than a length of each of the plurality of first dummy patterns.

14. The display device of claim 9, further comprising at least one sixth dummy pattern having a width in the first direction greater than a width of each of the plurality of first dummy patterns.

15. A display device comprising:
   a first electrode group comprising a plurality of electrodes spaced apart in a first direction and extending in a second direction intersecting the first direction;
   a second electrode group spaced apart from the first electrode group in the second direction and comprising a plurality of electrodes;
   a plurality of light emitting elements disposed on the electrodes spaced apart in the first direction of the first electrode group;
   a plurality of contact electrodes, each of the plurality of contact electrodes electrically contacting at least one of the electrodes of the first electrode group and the second electrode group and a number of the plurality of light emitting elements; and
   a plurality of dummy patterns disposed in a first area between the first electrode group and the second electrode group,
   wherein a vertical distance in the first direction between different dummy patterns of the plurality of dummy patterns is greater than a gap between the electrodes spaced apart in the first direction of the first electrode group.

16. The display device of claim 15, wherein
the plurality of dummy patterns comprise a first dummy pattern spaced apart from the electrodes of the first electrode group and the second electrode group in the second direction, and
the first dummy pattern does not overlap the plurality of contact electrodes.

17. The display device of claim 16, wherein
the plurality of contact electrodes comprise:
   a plurality of first contact electrodes, each of the plurality of first contact electrodes being disposed on one of the plurality of electrodes of the first electrode group and the second electrode group; and
   a plurality of second contact electrodes, each of the plurality of second contact electrodes being disposed on two or more of the plurality of electrodes of the first electrode group and the second electrode group, and
the plurality of dummy patterns comprise:
   a second dummy pattern directly contacting each of the second contact electrodes; and
   a third dummy pattern overlapping one of the plurality of contact electrodes, the third dummy pattern not contacting a corresponding contact electrode of the plurality of contact electrodes.

18. The display device of claim 16, wherein at least one of the plurality of dummy patterns is directly connected to one of the plurality of electrodes of the first electrode group and the second electrode group.

19. The display device of claim 16, wherein a length of at least one of the plurality of dummy patterns in the second direction is greater than a length of the first dummy pattern.

20. The display device of claim 16, wherein a width of at least one of the plurality of dummy patterns in the first direction is greater than a width of the first dummy pattern.

* * * * *